United States Patent
Sugi

(10) Patent No.: US 8,269,269 B2
(45) Date of Patent: Sep. 18, 2012

(54) NONVOLATILE SEMICONDUCTOR MEMORY DEVICE AND MANUFACTURING METHOD THEREFOR

(75) Inventor: Motoki Sugi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 509 days.

(21) Appl. No.: 12/481,259

(22) Filed: Jun. 9, 2009

(65) Prior Publication Data

US 2010/0059813 A1  Mar. 11, 2010

(30) Foreign Application Priority Data

Sep. 11, 2008  (JP) ................................ 2008-233824

(51) Int. Cl.
*H01L 29/792* (2006.01)
(52) U.S. Cl. .. 257/326; 257/324; 257/325; 257/E29.309
(58) Field of Classification Search .......... 257/324–326, 257/E29.309
See application file for complete search history.

(56) References Cited

U.S. PATENT DOCUMENTS

| 6,953,965 B2 | 10/2005 | Goda et al. | |
| 7,099,190 B2 | 8/2006 | Noguchi et al. | |
| 7,109,549 B2* | 9/2006 | Ozawa | 257/315 |
| 7,183,607 B1* | 2/2007 | Lai et al. | 257/316 |
| 7,265,412 B2* | 9/2007 | Kihara | 257/320 |
| 7,476,928 B2* | 1/2009 | Kim | 257/314 |
| 7,489,006 B2* | 2/2009 | Watanabe et al. | 257/317 |
| 7,928,516 B2* | 4/2011 | Nishihara | 257/390 |
| 7,939,880 B2* | 5/2011 | Kang et al. | 257/324 |
| 8,017,990 B2* | 9/2011 | Nagano | 257/316 |
| 2003/0042558 A1 | 3/2003 | Noguchi et al. | |
| 2005/0006696 A1 | 1/2005 | Noguchi et al. | |
| 2008/0006873 A1 | 1/2008 | Om | |
| 2008/0194066 A1 | 8/2008 | Weimer | |
| 2009/0003070 A1* | 1/2009 | Gomikawa et al. | 365/185.17 |

FOREIGN PATENT DOCUMENTS

| JP | 2003-78043 | 3/2003 |
| JP | 2004-326867 | 11/2004 |

* cited by examiner

*Primary Examiner* — Allison P Bernstein
(74) *Attorney, Agent, or Firm* — Oblon, Spivak, McClelland, Maier & Neustadt, L.L.P.

(57) ABSTRACT

A gate electrode of a select gate transistor includes a gate insulating film that is formed on a semiconductor substrate, a lower gate electrode that is formed on the gate insulating film and that has a tapered portion in which a side surface on a side of a gate electrode of a memory cell transistor is in a tapered shape, a first oxide film, a silicon nitride film, a second oxide film, and a conductive film that are sequentially formed on the tapered portion, and an upper gate electrode that is connected to the conductive film and the lower gate electrode.

6 Claims, 28 Drawing Sheets

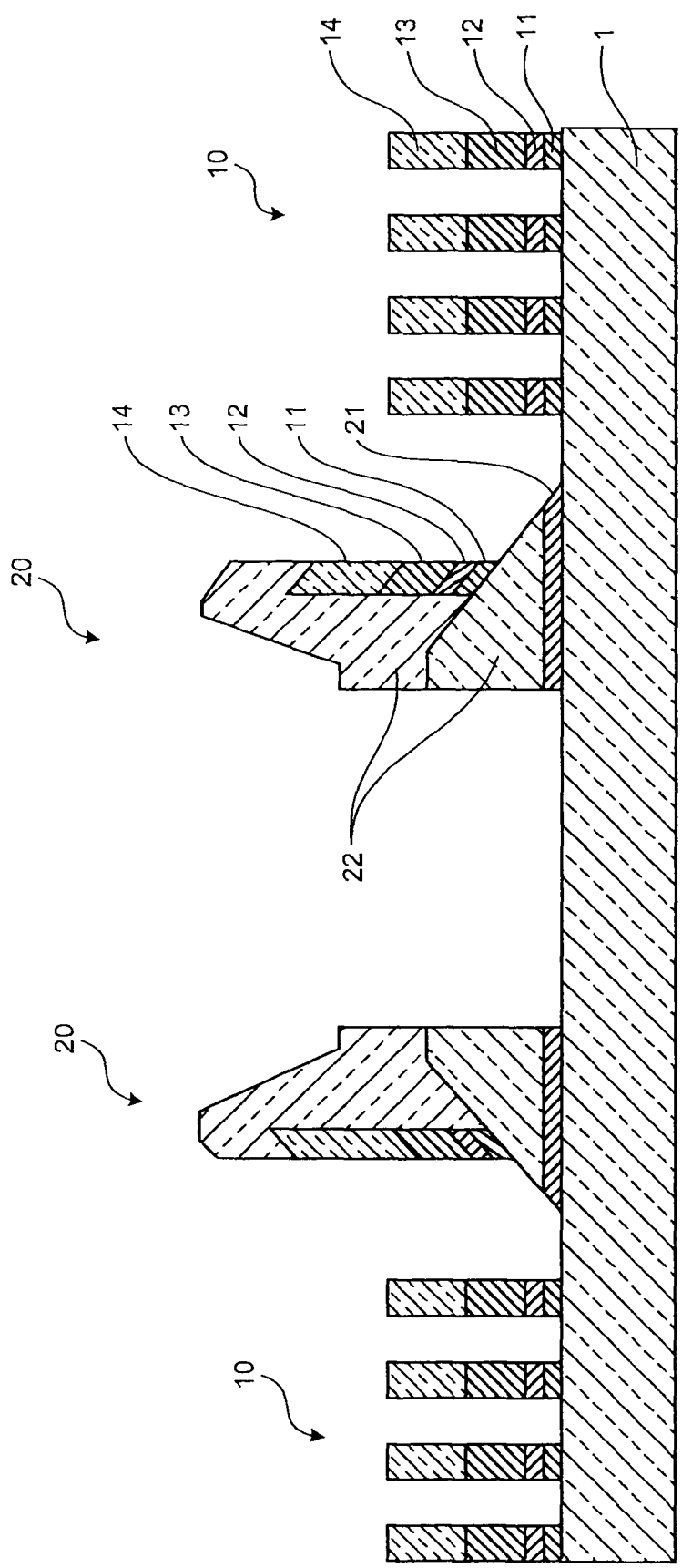

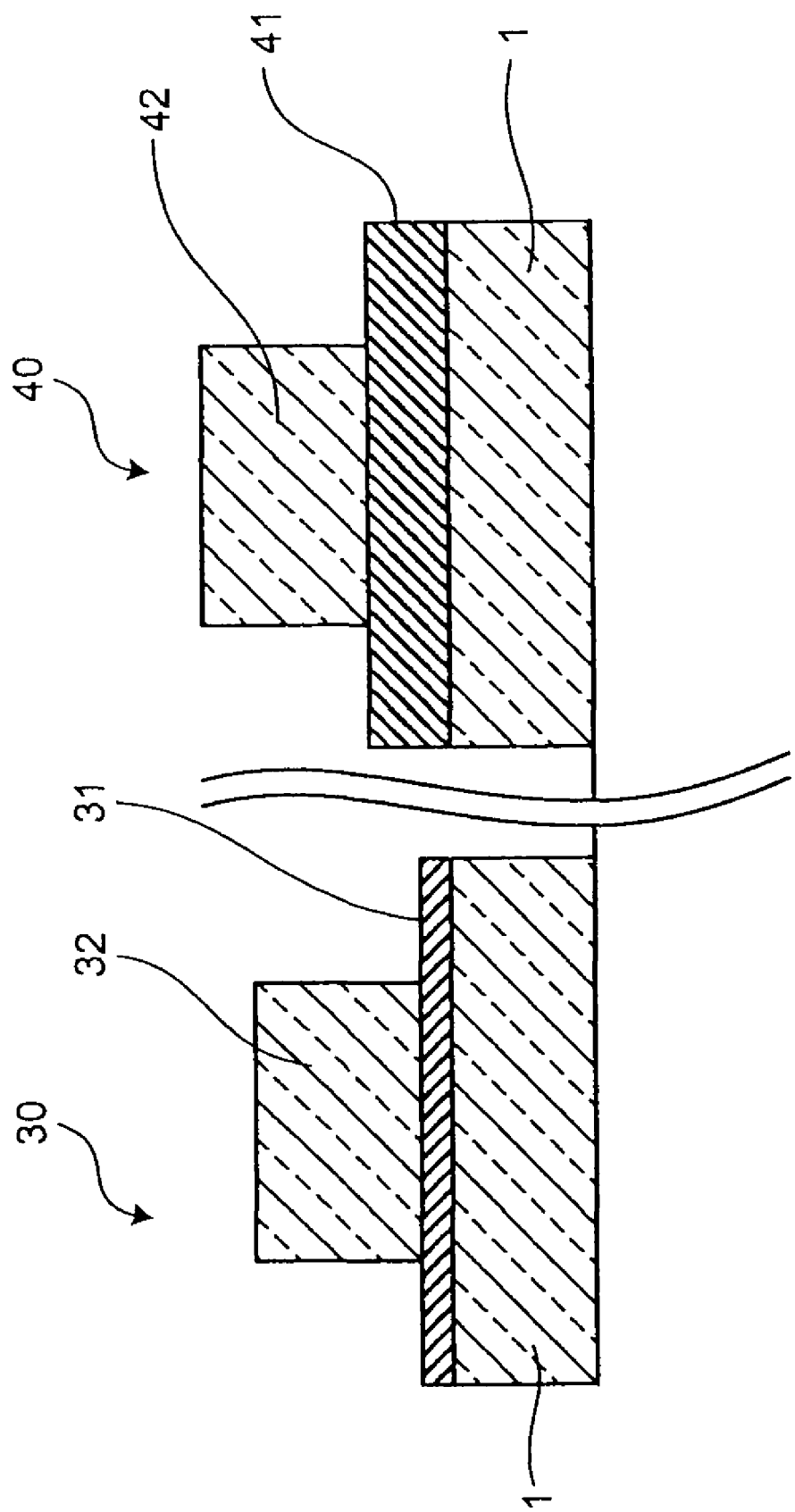

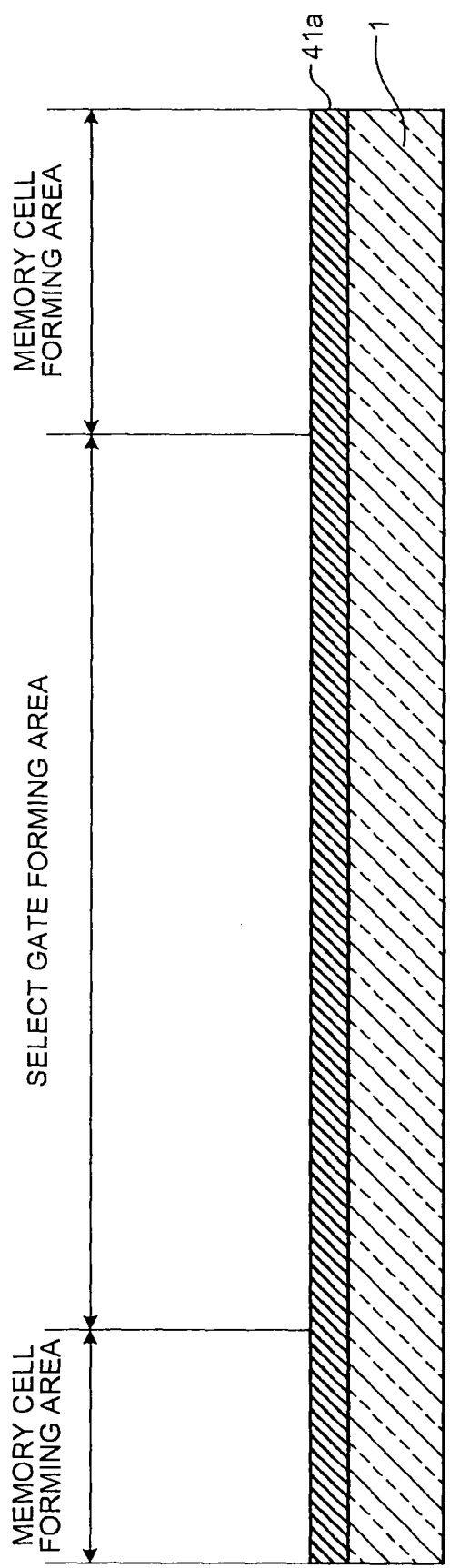
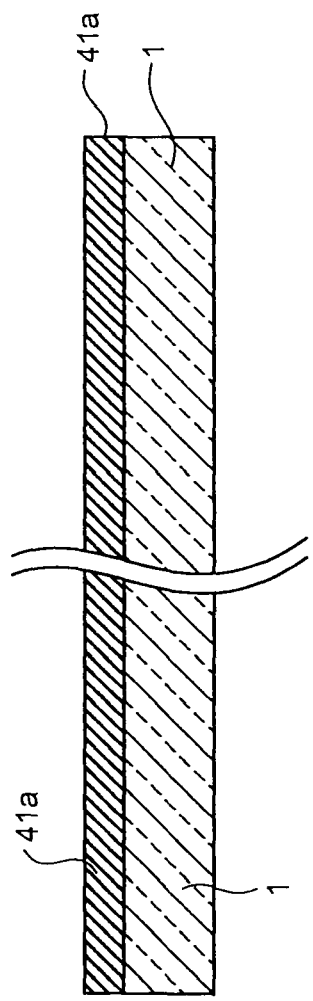

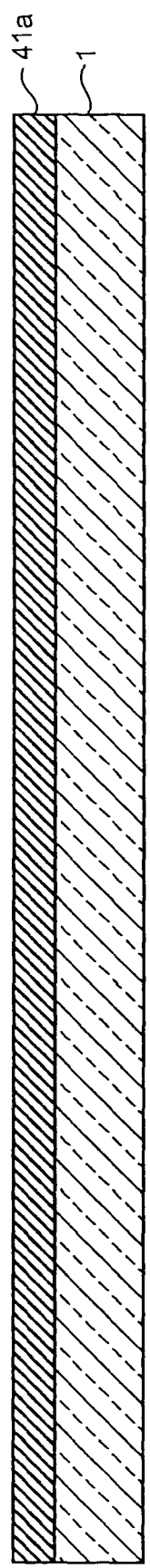
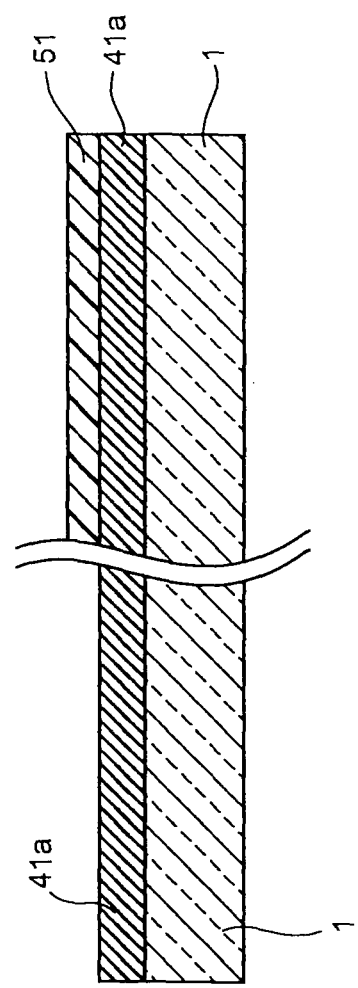

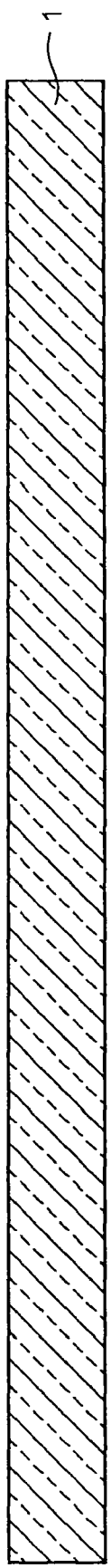
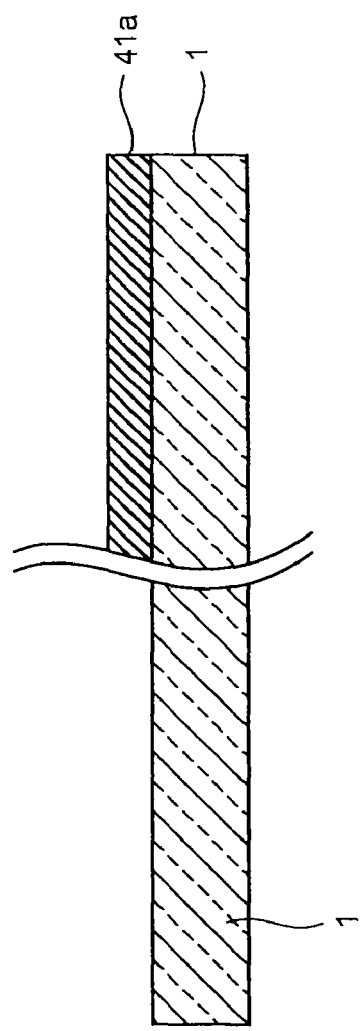

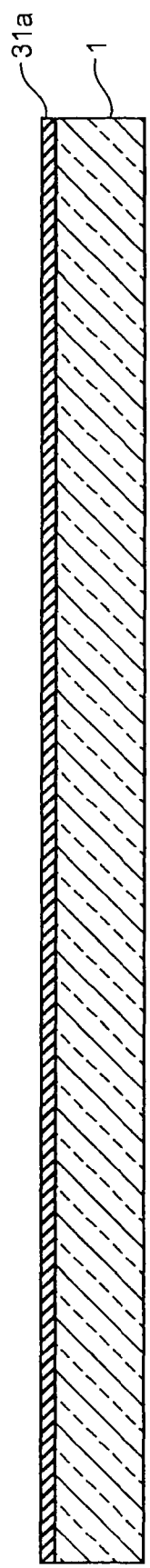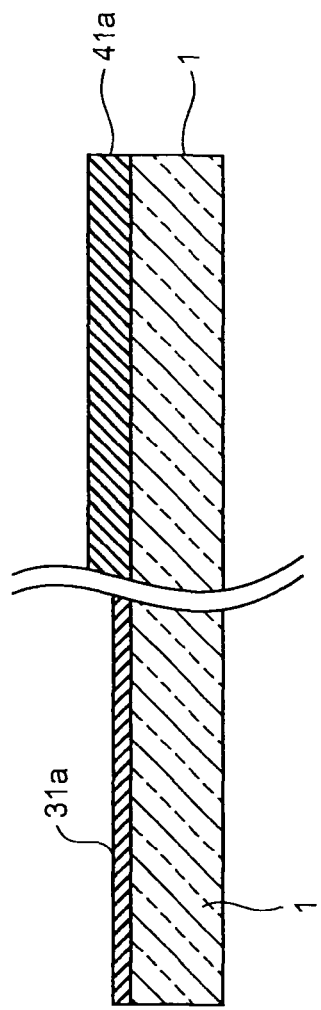
FIG.7A
FIG.7B

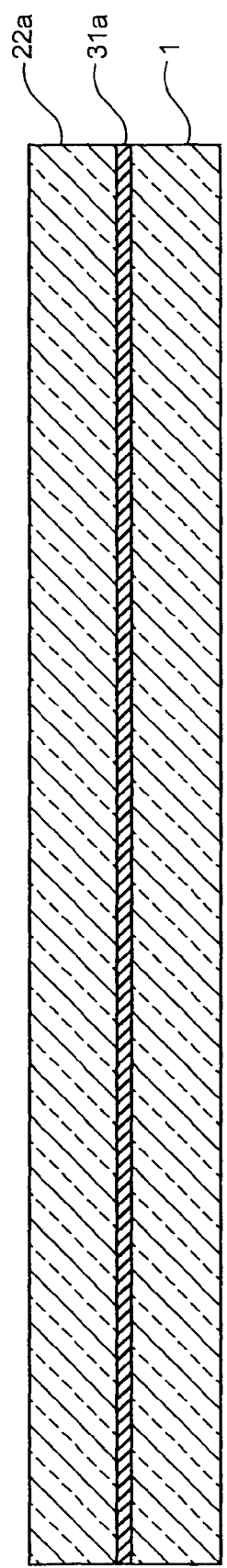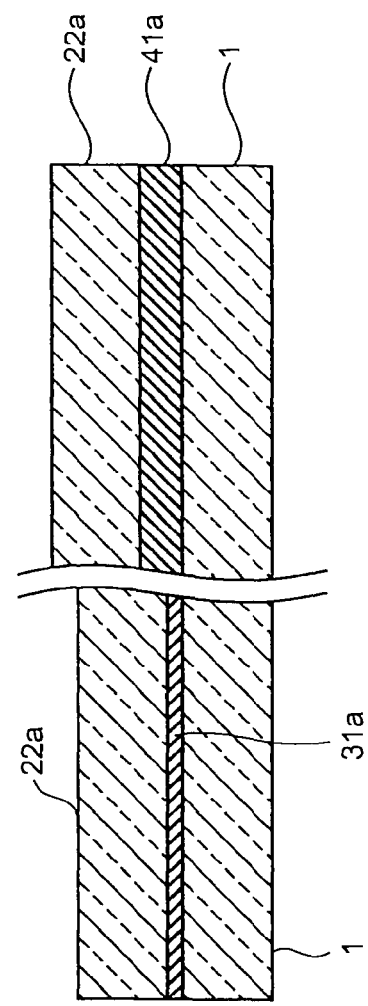
FIG.8A
FIG.8B

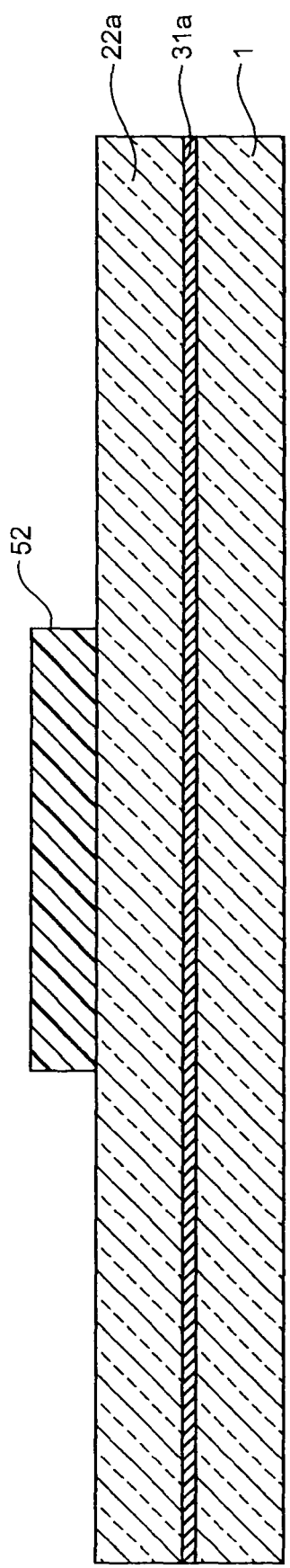
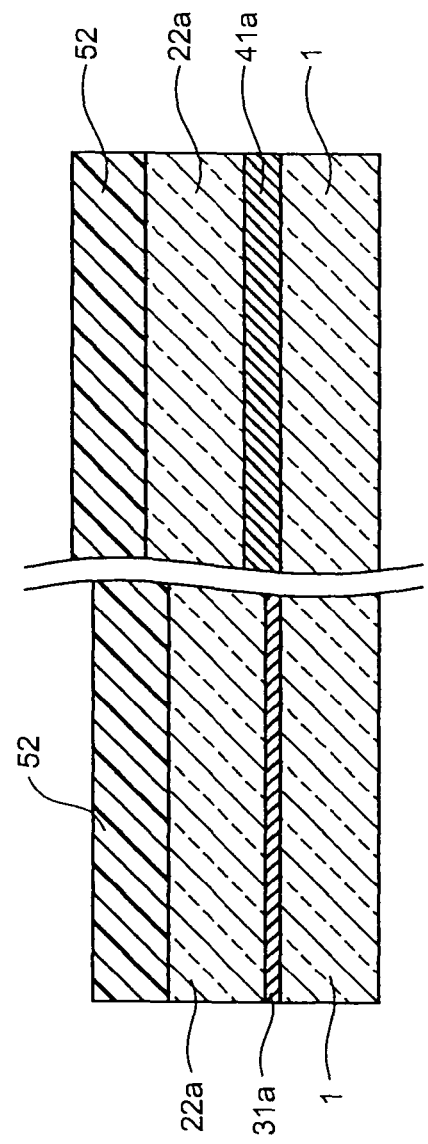
FIG.9A
FIG.9B

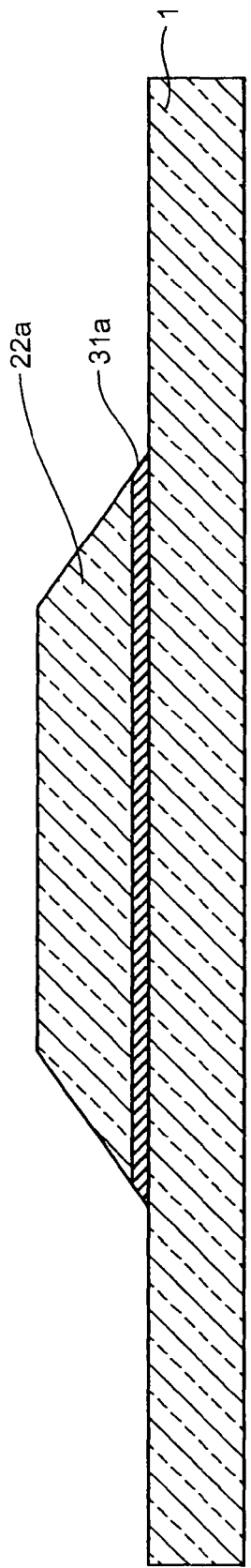
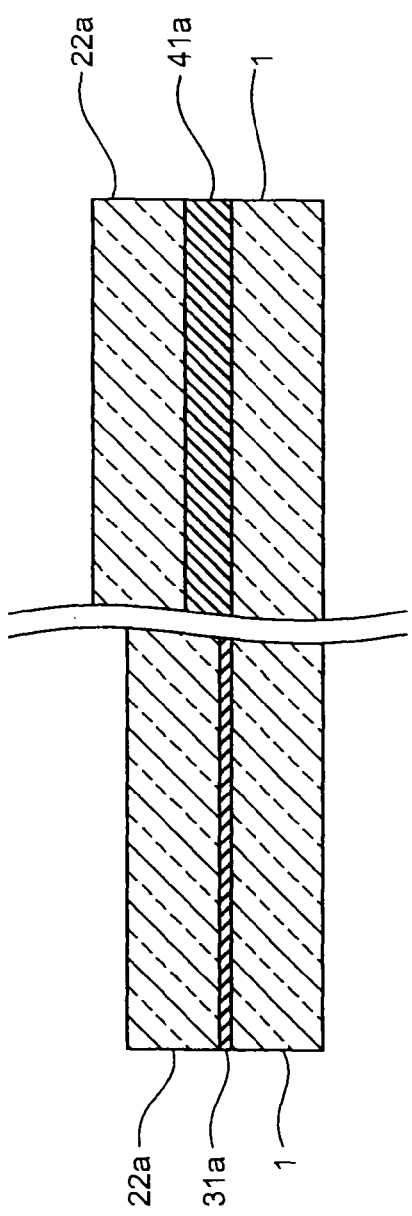
FIG.10A
FIG.10B

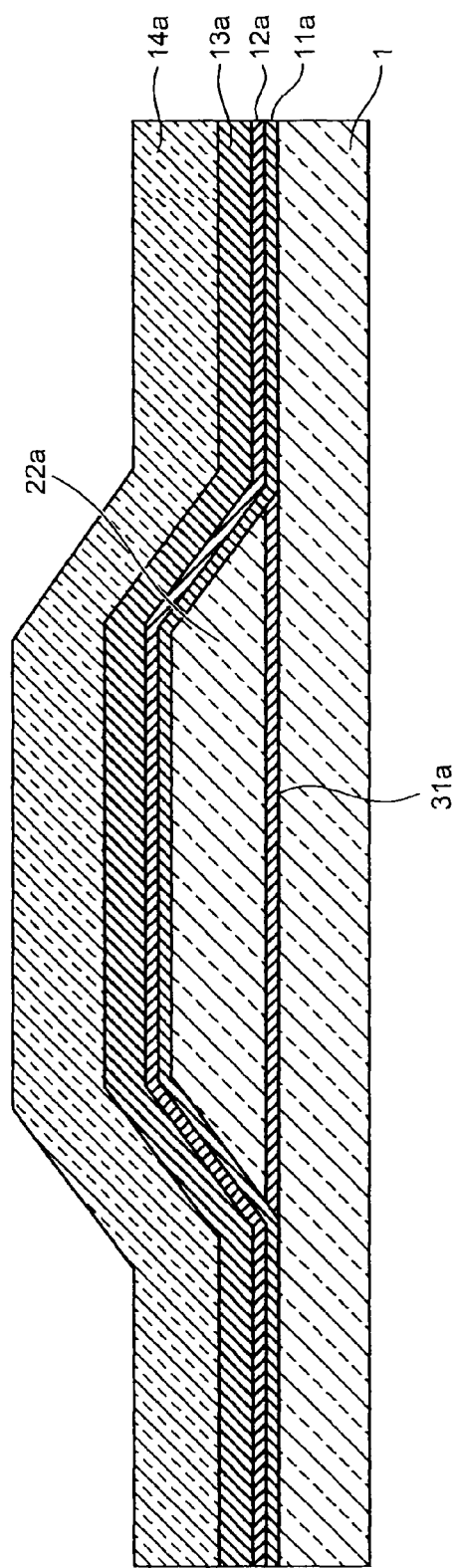
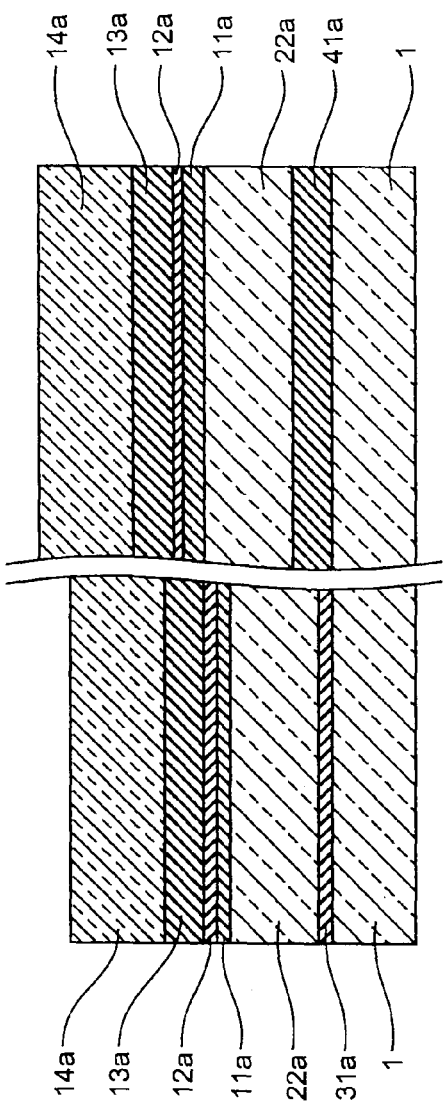
FIG.11A
FIG.11B

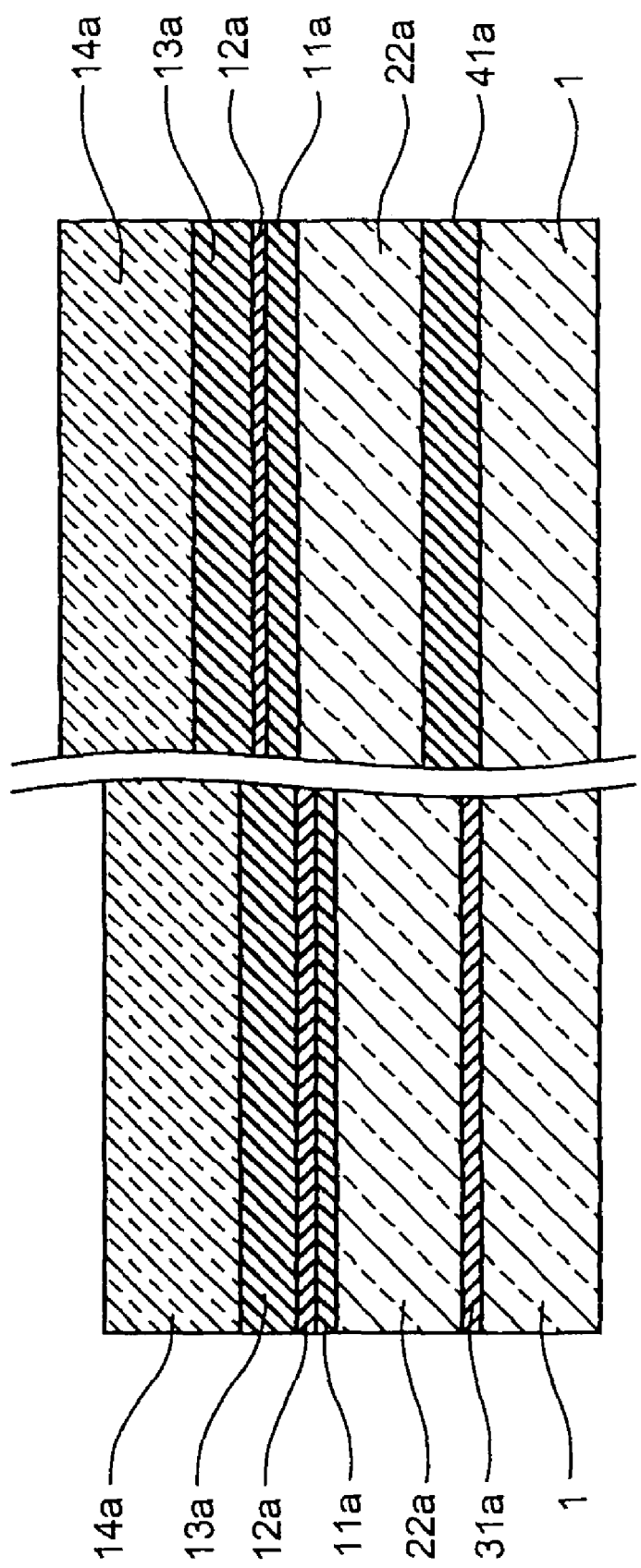

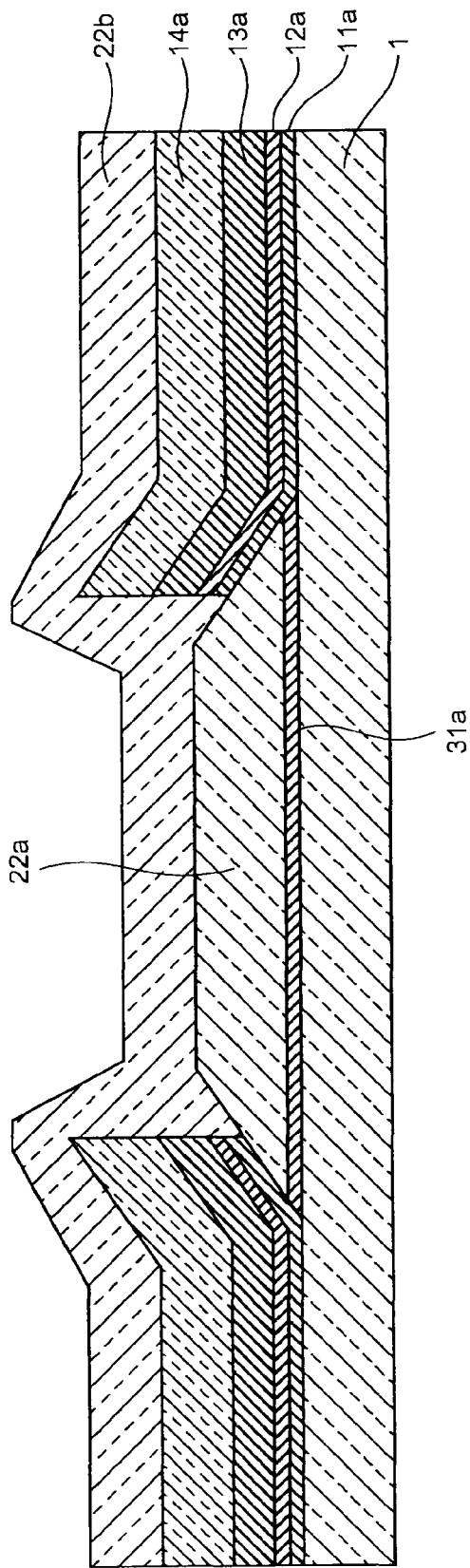
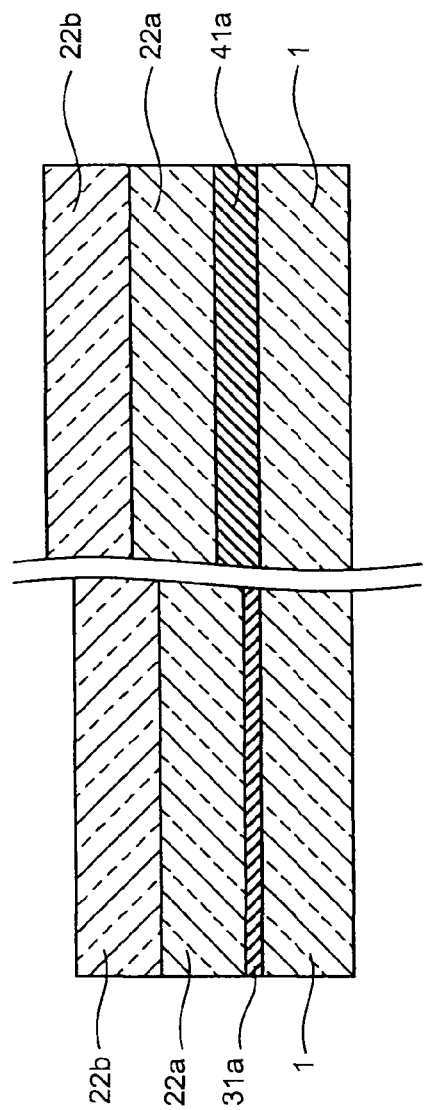
FIG.14A
FIG.14B

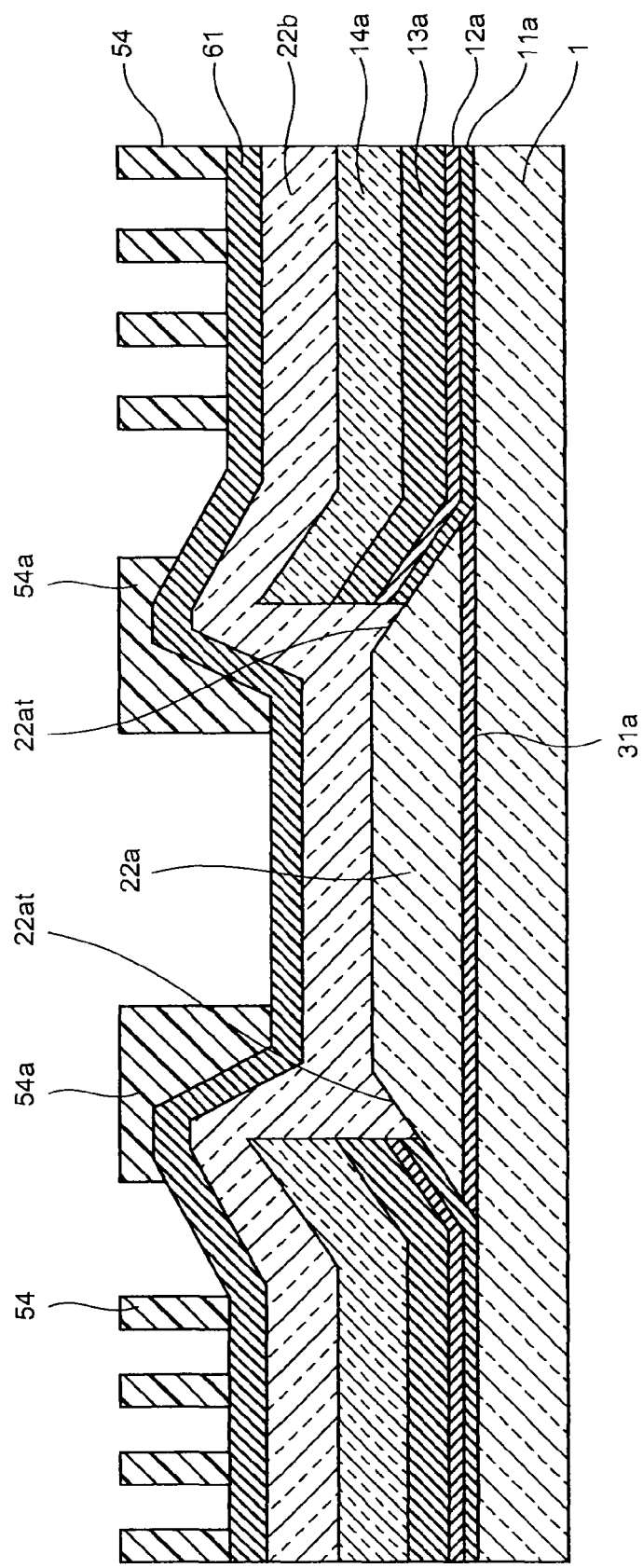

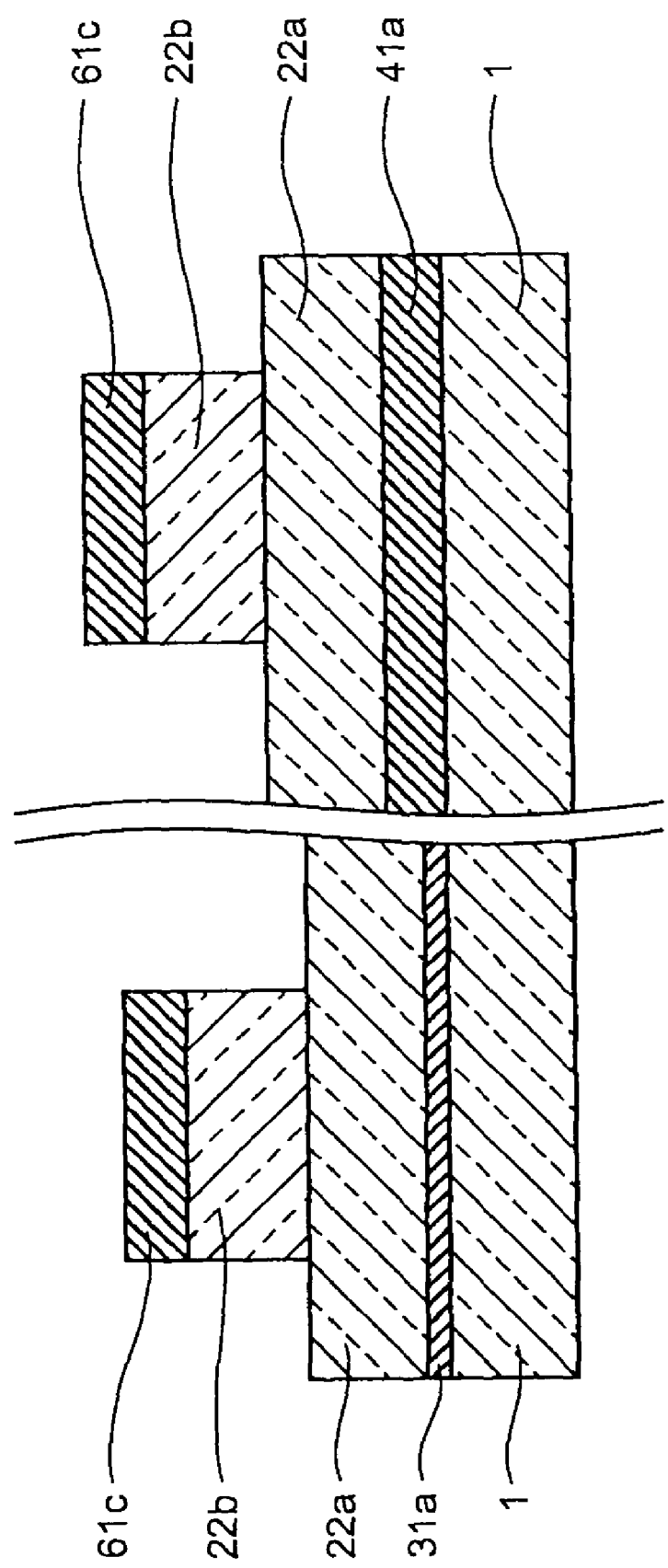

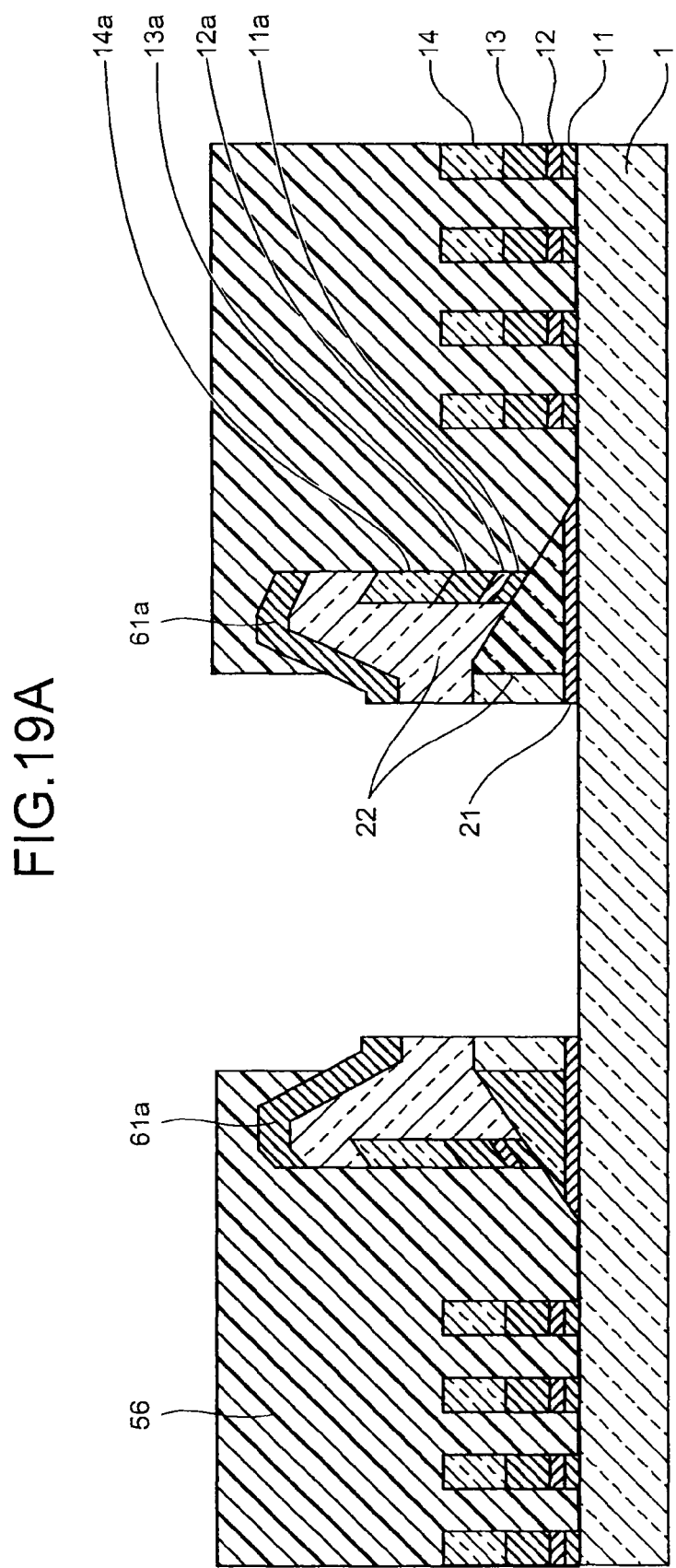

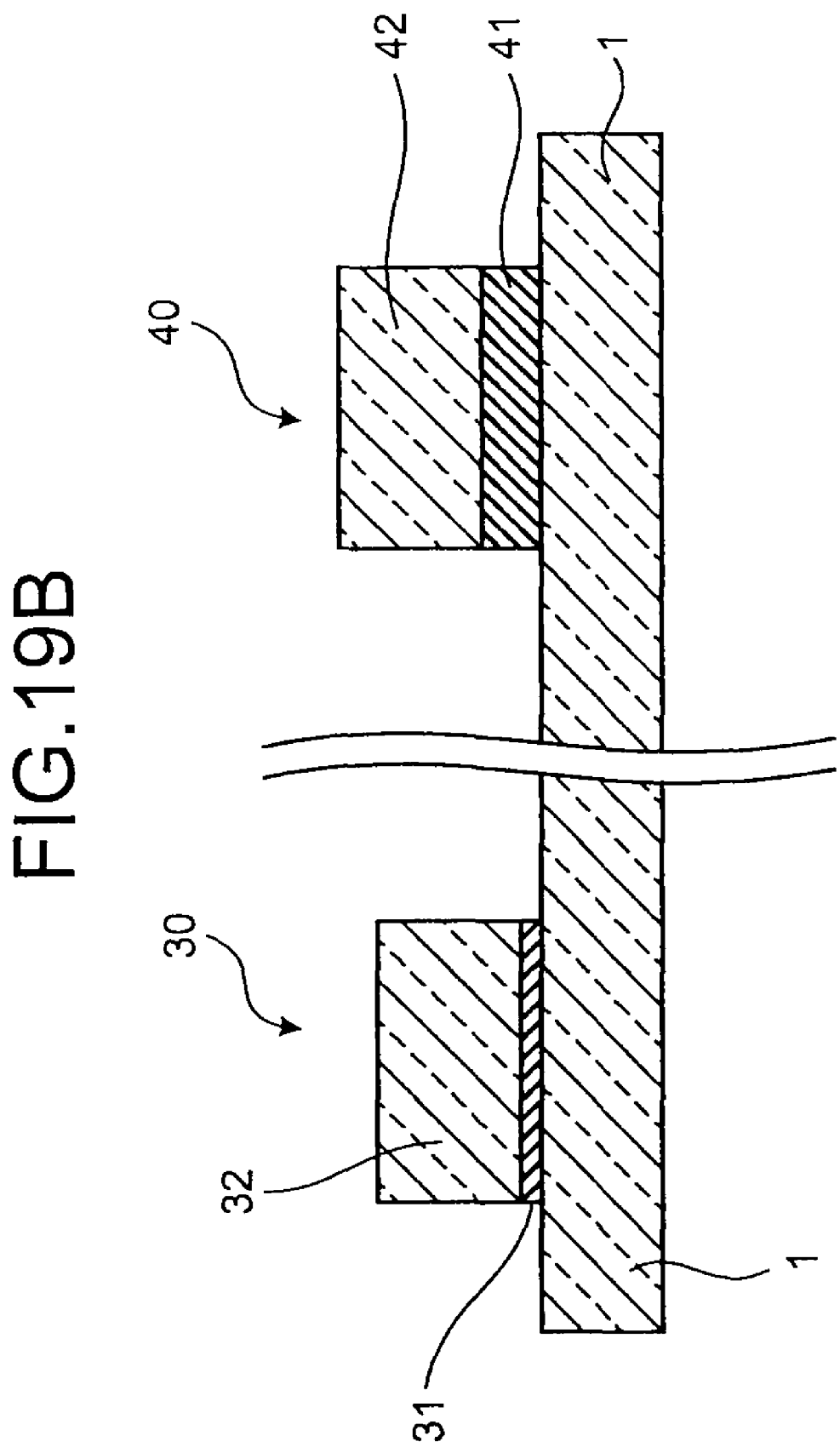

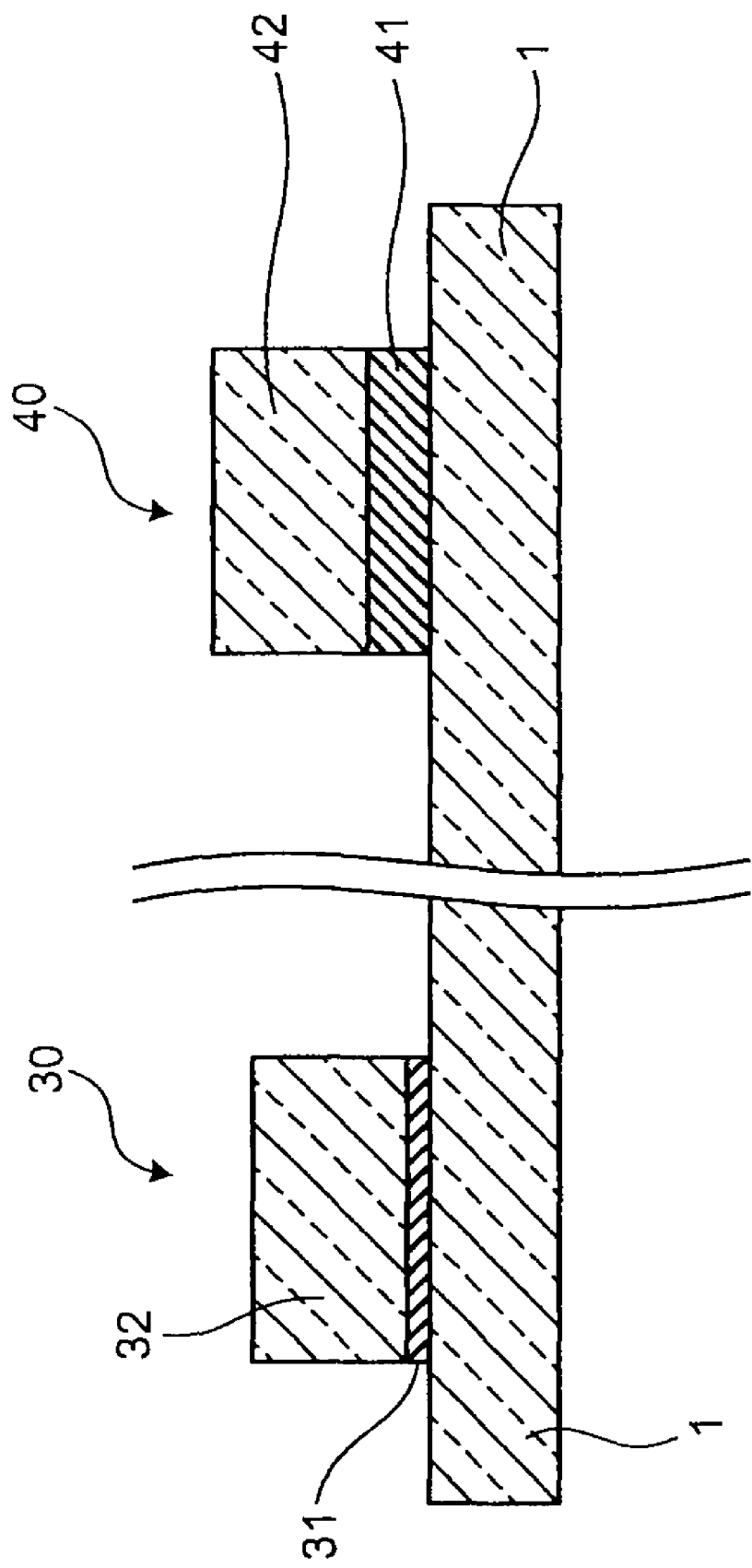

NONVOLATILE SEMICONDUCTOR MEMORY DEVICE AND MANUFACTURING METHOD THEREFOR

CROSS-REFERENCE TO RELATED APPLICATIONS

This application is based upon and claims the benefit of priority from the prior Japanese Patent Application No. 2008-233824, filed on Sep. 11, 2008; the entire contents of which are incorporated herein by reference.

BACKGROUND OF THE INVENTION

1. Field of the Invention

The present invention relates to a nonvolatile semiconductor memory device and a manufacturing method therefor.

2. Description of the Related Art

Not AND (NAND) flash memories being a nonvolatile semiconductor memory device are generally configured with a memory cell array and peripheral circuits. In the memory cell array, a memory cell transistor (hereinafter, simply "memory cell") and a select gate transistor (hereinafter, simply "select gate") are present, and in the peripheral circuits, a high voltage transistor and a low voltage transistor are present.

The memory cell has a function of retaining information, and the select gate, the high voltage transistor, and the low voltage transistor have a function as transistors, that is, a function of switching ON and OFF of a signal. Because a memory cell and the other transistors have different functions, the device configurations thereof are also different.

In a general NAND flash memory using floating gate devices, the memory cell has a five-layer structure in which a tunnel insulating film, a floating gate electrode, a gate insulating film, and a control gate electrode are sequentially layered on a substrate. On the other hand, other transistors have a three-layer structure in which a gate insulating layer and a gate electrode are layered on a substrate.

Generally, when a NAND flash memory using floating gate devices is manufactured, basically the same processes as those of other transistors are used up to the formation of a gate insulating film, except ion implantation. That is, a gate insulating film is also formed once in the transistors other than the memory cell. Thereafter, only the gate insulating film on the transistors other than the memory cell is opened, and a conductive film to be the control gate is layered thereon. This is also formed on the memory cell.

Through such a process, the memory cell has a structure in which the floating gate electrode and the control gate electrode are electrically insulated by the gate insulating film. The transistors other than the memory cell have a structure in which the floating gate electrode and the control gate electrode are electrically connected by the open gate insulating film, that is, a single-gate electrode structure.

On the other hand, in a NAND flash memory using metal oxide nitride oxide silicon (MONOS) devices, for example, as disclosed in Japanese Patent Application Laid-Open No. 2003-78043, the memory cell has a structure in which a tunnel insulating film, a charge-trap (charge storage) insulating film, a block insulating film, and a control gate electrode are sequentially layered on a substrate. However, such a manufacturing method as that of the NAND flash memory using floating gate devices cannot be employed for the flash memory using MONOS devices. This is because in the NAND flash memory using the MONOS devices, a structure corresponding to the floating gate is the charge-trap insulating film, and therefore, even if it is connected to the control gate electrode, the film does not work as a control gate. Therefore, for the flash memory using MONOS devices, the select gate is also manufactured by the same process as the memory cell, and has the same MONOS structure as the memory cell.

However, if the select gate is formed in the MONOS structure, the following problems are concerned. When low voltage is applied to the select gate at the time of reading from the memory cell, electrons are injected into the charge-trap (charge storage) insulating film of the select gate, and the threshold of the select gate changes. At this time, the threshold of the select gate changes to a higher value while readout voltage is fixed, and therefore current when the select gate is turned on becomes small, and the cell current is degraded. Such degradation of the cell current becomes a cause of erroneous readout.

BRIEF SUMMARY OF THE INVENTION

A nonvolatile semiconductor memory device according to an embodiment of the present invention comprises: a gate electrode of a memory transistor including a first insulating layer that is formed on a semiconductor substrate, a charge storage layer that is formed on the first insulating layer, a second insulating layer that is formed on the charge storage layer, and a gate electrode that is formed on the second insulating layer; and a gate electrode of a select gate transistor that is formed adjacent to the gate electrode of the memory cell transistor, the gate electrode of the select gate transistor including a gate insulating film that is formed on the semiconductor substrate, a lower gate electrode that is formed on the gate insulating film and that has a tapered portion in a tapered shape at a side surface on a side of the gate electrode of the memory transistor, a first oxide film that is formed on the tapered portion of the lower gate electrode, a silicon nitride film that is formed on the first oxide film, a second oxide film that is formed on the silicon nitride film, a conductive film that is formed on the second oxide film, and an upper gate electrode that is connected to the conductive film and the lower gate electrode.

A manufacturing method of a nonvolatile semiconductor memory device, according to an embodiment of the present invention comprising: sequentially forming a first insulating film and a first conductive film in layer in a first gate-electrode area of a memory transistor on a semiconductor substrate and in a second gate-electrode area of a select gate transistor that is adjacent to the first gate-electrode area; processing the first conductive film in a trapezoidal shape in the second gate-electrode area, by removing the first conductive film and the first insulating film in the first gate-electrode area; sequentially forming a first oxide film, a nitride film, a second oxide film, and a second conductive film in the first and the second gate-electrode areas; exposing an upper surface of the first conductive film by etching the second conductive film, the second oxide film, the nitride film, and the first oxide film in a direction perpendicular to an in-plane direction of the semiconductor substrate to leave the second conductive film, the second oxide film, the nitride film, and the first oxide film in an area on an inclined plane of the first conductive film that is processed in the trapezoidal shape and in the first gate-electrode area; forming a third conductive film that connects the first conductive film and the second conductive film, in the second gate-electrode area; forming a memory cell that has a first oxide film, a nitride film, a second oxide film, and a second conductive film in this sequence on the semiconductor substrate by etching the second oxide film, the nitride film, and the first oxide film in a memory cell area in a direction perpendicular to an in-plane direction of the semiconductor substrate to perform patterning, and then forming an end surface thereof on a side of the first gate-electrode area by etching the second conductive film, the second oxide film, the nitride film, and the first oxide film in the direction perpendicular to the in-plane direction of the semiconductor substrate at a position on the inclined plane of the first conductive film to leave the second conductive film, the second oxide film, the nitride film, and the first oxide film on the inclined plane of the first conductive film; and forming a gate electrode of the select gate transistor that has the first insulating film the first conductive film, the first oxide film that is layered on the inclined plane of the first conductive film, the nitride film, the second oxide film, the second conductive film, and the third conductive film that connects the first conductive film and the second conductive film by forming an end surface on an opposite side to the first gate-electrode area by etching the third conductive film, the first conductive film, and the first insulating film in the direction perpendicular to the in-plane direction of the semiconductor substrate to leave a portion of the third conductive film at which the first conductive film and the second conductive are connected.

BRIEF DESCRIPTION OF THE DRAWINGS

FIGS. 3A and 3B are schematic diagrams for explaining a cross-sectional structure of the memory cell area and a peripheral circuit area of the MONOS-type NAND flash memory according to the embodiment;

FIGS. 4A and 4B are cross-sections of a manufacturing method of the MONOS-type NAND flash memory according to the embodiment;

FIGS. 5A and 5B are cross-sections of a manufacturing method of the MONOS-type NAND flash memory according to the embodiment;

FIGS. 6A and 6B are cross-sections of a manufacturing method of the MONOS-type NAND flash memory according to the embodiment;

FIGS. 7A and 7B are cross-sections of a manufacturing method of the MONOS-type NAND flash memory according to the embodiment;

FIGS. 8A and 8B are cross-sections of a manufacturing method of the MONOS-type NAND flash memory according to the embodiment;

FIGS. 9A and 9B are cross-sections of a manufacturing method of the MONOS-type NAND flash memory according to the embodiment;

FIGS. 10A and 10B are cross-sections of a manufacturing method of the MONOS-type NAND flash memory according to the embodiment;

FIGS. 11A and 11B are cross-sections of a manufacturing method of the MONOS-type NAND flash memory according to the embodiment;

FIGS. 12A and 12B are cross-sections of a manufacturing method of the MONOS-type NAND flash memory according to the embodiment;

FIGS. 14A and 14B are cross-sections of a manufacturing method of the MONOS-type NAND flash memory according to the embodiment;

FIGS. 16A and 16B are cross-sections of a manufacturing method of the MONOS-type NAND flash memory according to the embodiment;

FIGS. 17A and 17B are cross-sections of a manufacturing method of the MONOS-type NAND flash memory according to the embodiment;

FIGS. 19A and 19B are cross-sections of a manufacturing method of the MONOS-type NAND flash memory according to the embodiment;

FIGS. 20A and 20B are cross-sections of a manufacturing method of the MONOS-type NAND flash memory according to the embodiment.

DETAILED DESCRIPTION OF THE INVENTION

Figure 1:
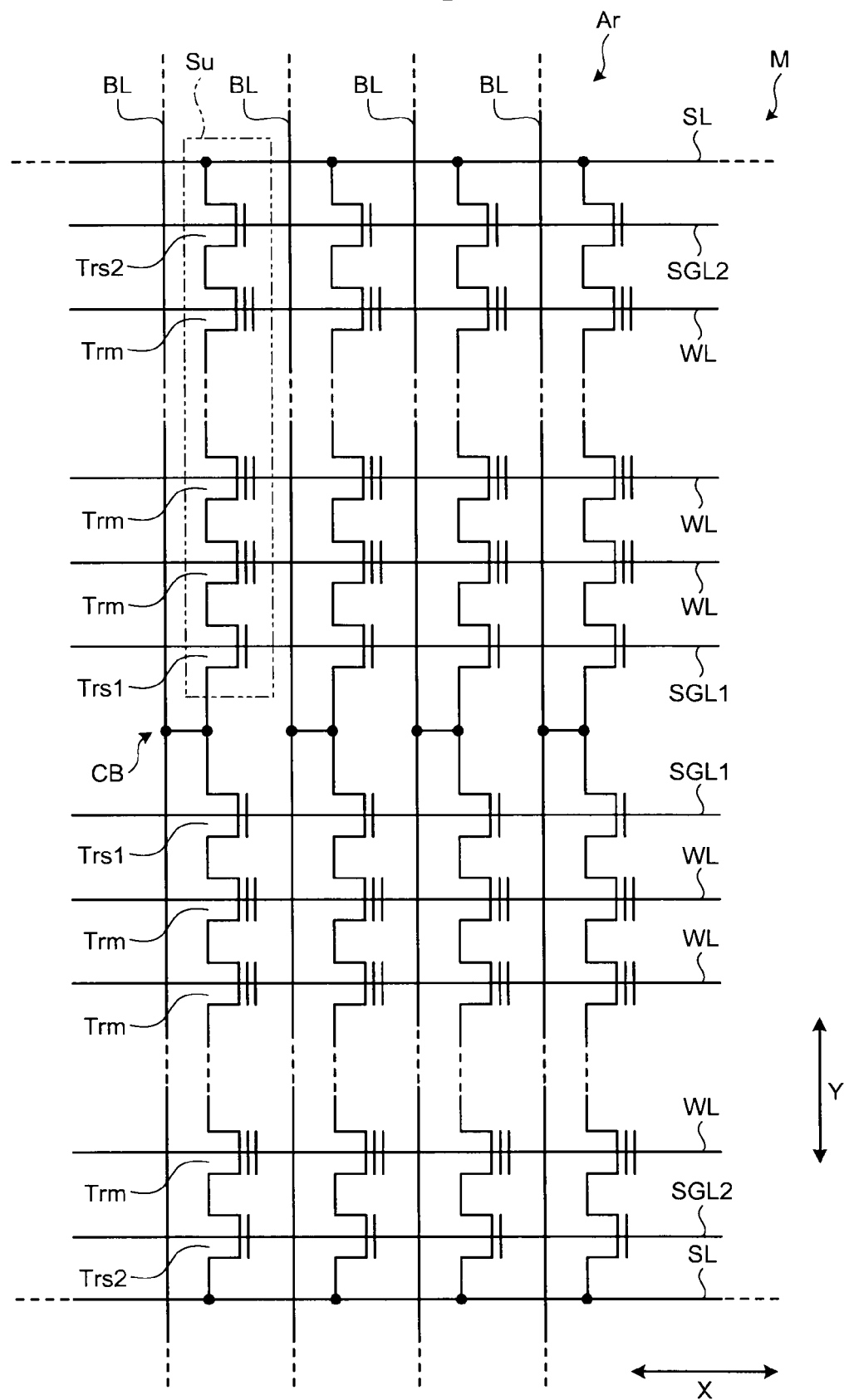
FIG. 1 is an equivalent circuit diagram of a part of a memory cell array of a MONOS-type NAND flash memory according to an embodiment of the present invention.

Exemplary embodiments of a nonvolatile semiconductor memory device and a manufacturing method therefor according to the present invention will be explained below in detail with reference to the accompanying drawings. The present invention is not limited to the following embodiments.

Exemplary embodiments of a NAND flash memory using MONOS devices (hereinafter, "MONOS-type NAND flash memory") as a nonvolatile semiconductor memory device according to the present invention will be explained below in detail with reference to the accompanying drawings. In the descriptions of the drawings, like reference numerals or letters refer to the same or like parts. The drawings are schematic, characteristic parts of the embodiments are mainly shown, and relationships between thicknesses and planar dimensions, ratios of thickness of respective layers and the like are different from relationships and ratios in practice.

An electrical configuration of a MONOS-type NAND flash memory according to an embodiment of the present invention is explained first. The MONOS-type NAND flash memory is sectioned into a memory cell area in which a memory cell array Ar is structured, and a peripheral circuit area in which peripheral circuits to drive the memory cell array Ar are structured. FIG. 1 is an equivalent circuit diagram of a part of the memory cell array Ar of the NAND flash memory.

The memory cell array Ar is configured with NAND cell units Su arranged in a matrix, each of which is constituted by two select gate transistors Trs1 and Trs2 and a plurality (for example, 32) of memory cell transistors Trm connected in series between the select gate transistors Trs1 and Trs2.

In the NAND cell unit Su, the memory cell transistors Trm are formed such that source/drain areas are shared by adjacent transistors. The memory cell transistors Trm arranged in an X-direction (direction of word line) in FIG. 1 are connected by a word line WL in common.

The select gate transistors Trs1 arranged in the X-direction in FIG. 1 are connected by a select gate line SGL1 in common, and the select gate transistors Trs2 are connected by a select gate line SGL2 in common. To a drain region of the select gate transistor Trs1, a bit line contact CB is connected. The bit line contact CB is connected to a bit line BL that extends in a Y-direction (corresponding to a direction of bit line) that is perpendicular to the X-direction in FIG. 1. Further, the select gate transistor Trs2 is connected to a source line SL through a source region.

Figure 2:
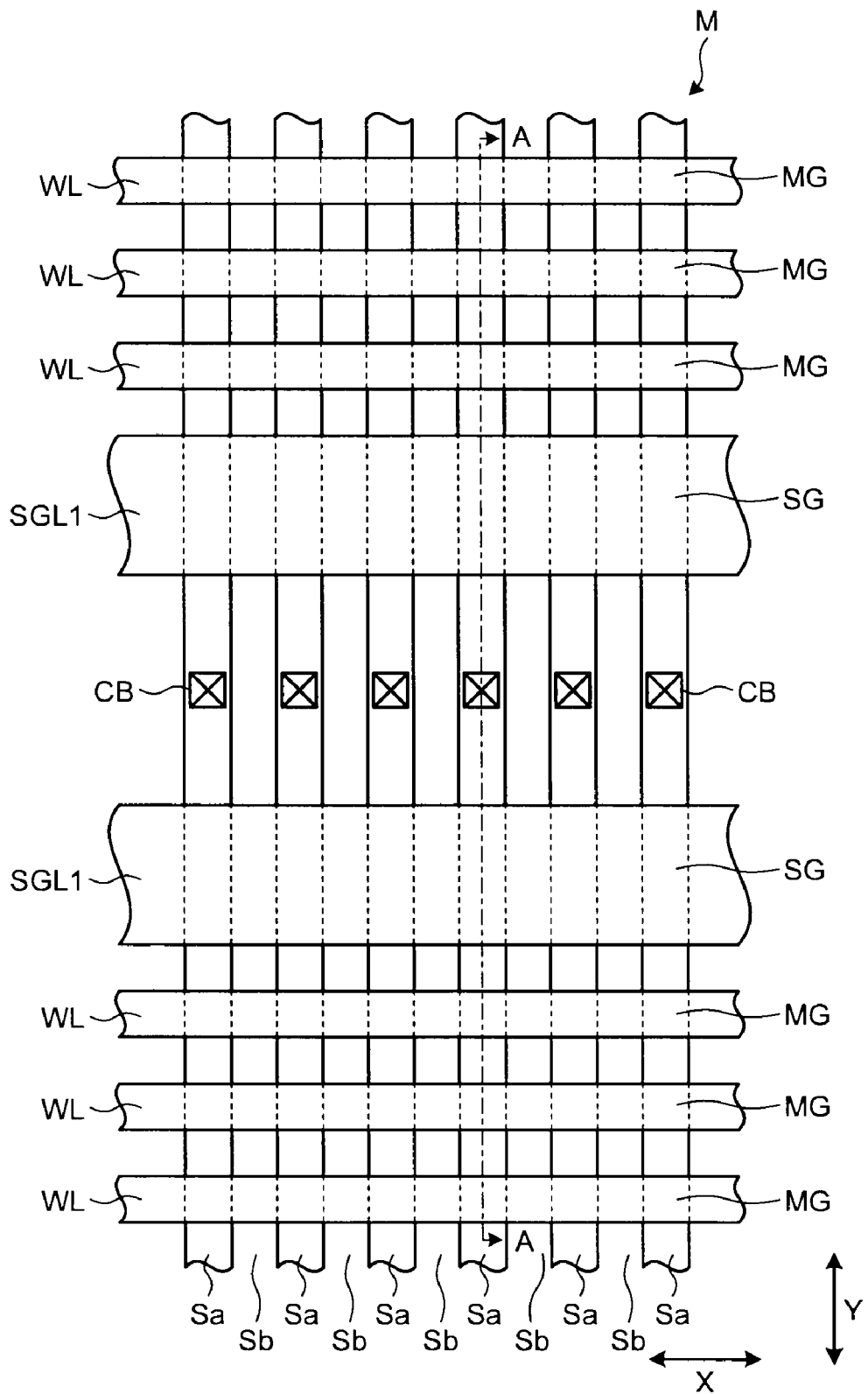
FIG. 2 is a plan view of a layout pattern near a bit line contact in a memory cell area of the MONOS-type NAND flash memory according to the embodiment.

FIG. 2 is a plan view of a layout pattern near the bit line contact CB in a memory cell area. As shown in FIG. 2, in a memory cell area M, a device isolation region Sb in a shallow trench isolation (STI) structure is formed along the Y-direction in FIG. 2. The device isolation regions Sb are aligned in the X-direction keeping a predetermined interval from each other, and therefore the device isolation regions (active areas) Sb are formed along the Y-direction in FIG. 2. The device isolation regions Sb are formed separately in the X-direction.

The word lines WL are formed along the X-direction, perpendicularly to device regions Sa. The word lines WL are formed separately in the Y-direction. Moreover, the select gate lines SGL that connect the select gate transistors in common are formed along the X-direction in FIG. 2. These select gate lines SGL1 are formed in pair in the Y-direction. On the device regions Sa positioned between the pair of select gate lines SGL1, the bit line contact CB are respectively formed.

On a portion at which the device region Sa intersects with the word line WL, a gate electrode MG of the memory cell transistor is formed. On a portion at which the device region Sa intersects with the select gate line SGL1, a gate electrode SG of the select gate transistor is formed.

FIGS. 3A and 3B are schematic diagrams for explaining a cross-sectional structure of high voltage/low voltage transistors in the memory cell area and the peripheral circuit area of the MONOS-type NAND flash memory. FIG. 3A is a cross-section taken along a line A-A in FIG. 2, and FIG. 3B is a schematic diagram for explaining a structure of a high voltage transistor and a low voltage transistor, and is a cross-section in a direction perpendicular to an in-plane direction of a semiconductor substrate.

As shown in FIG. 3A, a gate electrode 10 of the memory cell transistor has a four-layer structure in which a tunnel insulating film 11 that is made of a silicon oxide film serving as a first insulating layer, a charge-trap film 12 that is made of a silicon nitride film serving as a charge storage layer, a block insulating film 13 that is made of an aluminum oxide ($Al_2O_3$) film serving as a second insulating layer, and a control gate electrode 14 that is made of a polysilicon film are sequentially layered on a semiconductor substrate 1. A gate electrode 20 of the select gate transistor has a two-layer structure in which a gate insulating film 21 that is made of a silicon oxide film and a gate electrode 22 that is made of a polysilicon film are sequentially layered on the semiconductor substrate 1. A low voltage transistor 30 has a two-layer structure in which a gate insulating film 31 and a gate electrode 32 are layered on the semiconductor substrate 1 as shown in FIG. 3B. A high voltage transistor 40 has a two-layer structure in which a gate insulating film 41 and a gate electrode 42 are layered on the semiconductor substrate 1 as shown in FIG. 3B. While each of the transistors has source/drain regions, detailed explanations thereof will be omitted.

While in the low voltage transistor 30, the gate insulating film 31 having a film thickness of about 8 to 10 nanometers is used as the gate insulating film, in the high voltage transistor 40, the gate insulating film 41 having a film thickness of about 40 nanometers is used. This is because the high voltage transistor 40 is used at a place where high voltage is applied to the gate electrode 42, and the gate insulating film 41 is required not to be damaged even under such high voltage.

In the present embodiment, the gate electrode 20 of the select gate transistor has such a structure that the gate insulating film 21 and the gate electrode 22 are layered on the semiconductor substrate 1 as described above, and has the same MOS structure as the low voltage transistor 30 in which the gate insulating film 31 and the gate electrode 32 are layered on the semiconductor substrate 1, from the viewpoint of the structure in which an insulating film and a gate electrode are layered on the semiconductor substrate 1. Moreover, the gate insulating film 21 has the same thickness as the gate insulating film 31 of the low voltage transistor 30.

When the gate electrode 20 of the select gate transistor has a MONOS structure, problems described below are concerned. That is, when weak voltage is applied to the select gate transistor at the time of reading from the memory cell transistor, electrons are injected into the charge trap (charge storage) film of the gate electrode of the select gate transistor, and the threshold of the select gate transistor changes. At this time, the threshold of the select gate transistor changes to a higher value while readout voltage is fixed, and therefore current when the select gate transistor is turned on becomes small, and the cell current is degraded. Such degradation of the cell current becomes a cause of erroneous readout.

Therefore, in the present embodiment, the gate electrode 20 of the select gate transistor is formed in a MOS structure same as that of the low voltage transistor 30 and the like in the peripheral circuit, thereby preventing erroneous readout to achieve high readout reliability.

Furthermore, in the gate electrode 20 of the select gate transistor, an end of the gate electrode 22 on a side of the gate electrode 10 of the memory cell transistor is a tapered portion having a tapered shape, and on this tapered portion, an oxide film 11a, a nitride film 12a, an oxide film 13a, and a conductive film 14a are layered in this sequence. That is, it has a structure in which the gate electrode 22 being a conductive film is arranged under the oxide film 11a, the nitride film 12a, the oxide film 13a, and the conductive film 14a. Accordingly, the gate electrode 20 of the select gate transistor does not have the MONOS structure, and the structure on the gate insulating film 21 functions as a MOS gate electrode.

As described above, in the MONOS-type NAND flash memory according to the present embodiment, the gate electrode 20 of the select gate transistor is formed in the MOS structure same as the low voltage transistor 30 and the like in the peripheral circuit. This enables to prevent erroneous readout caused by a structure of the gate electrode 20 of the select gate transistor, and a MONOS-type NAND flash memory with high readout reliability is achieved.

Next, a manufacturing method of each transistor in the MONOS-type NAND flash memory configured as above is explained up to a gate electrode forming process. In the manufacturing method, processes relating to a structure of the transistors are focused herein, and explanations of an ion implantation process, a heating process or the like, which are not directly related to features of the present invention, will be omitted.

First, an oxide film having a thickness of approximately 40 nanometers is formed as an insulating film 41a on the semiconductor substrate 1, for example, by thermal oxidization (FIGS. 4A and 4B). As the semiconductor substrate 1, for example, a silicon substrate is used. Next, a resist pattern 51 is formed on the insulating film 41a by a photo engraving process (PEP) as an exposure process to form a photoresist in a predetermined pattern (FIGS. 5A and 5B). The resist pattern 51 is formed to cover an area in which the high voltage transistor 40 is formed, and to open the other areas.

Subsequently, using the resist pattern 51, the insulating film 41a is removed by chemical processing to expose the semiconductor substrate 1 in the areas other than the area in which the high voltage transistor 40 is formed. Thereafter, the resist pattern 51 is removed (FIGS. 6A and 6B).

Next, an oxide film having a thickness of 8 to 10 nanometers is formed as an insulating film 31a on the semiconductor substrate 1, for example, by thermal oxidization (FIGS. 7A and 7B). Thus, on the semiconductor substrate 1, the insulating film 41a having a thickness of approximately 40 nanometers is formed in the area in which the high voltage transistor 40 is formed, and the insulating film 31a having a thickness of 8 to 10 nanometers is formed in the other areas.

Subsequently, as a conductive film 22a, for example, a conductive polysilicon film including impurities is formed on the insulating film 41a and the insulating film 31a by chemical vapor deposition (CVD) (FIGS. 8A and 8B). Further, on the conductive film 22a, a resist pattern 52 is formed by PEP (FIGS. 9A and 9B). The resist pattern 52 is formed to cover an area in which the gate electrodes of the select gate transistor, the low voltage transistor, and the high voltage transistor are formed, and to open the other areas.

Using the resist pattern 52 as a mask, etching is performed on the conductive film 22a by reactive ion etching (RIE), to expose the insulating film 31a in an area in which the memory cell transistor is formed. At this time, the etching of the conductive film 22a is performed such that an end of the conductive film 22a on a side of the area in which the memory cell transistor is formed is in a tapered shape having a predetermined angle relative to the semiconductor substrate 1. The formation of this tapered shape is important to form a structure in which the conductive film 22a comes under the oxide film 11a, the nitride film 12a, the oxide film 13a, and the conductive film 14a in a later process. Furthermore, it is preferable that an angle between an end surface of the tapered shape in the conductive film 22a and a surface of the semiconductor substrate 1 is as small as possible.

The exposed insulating film 31a is then removed by chemical processing, to expose the semiconductor substrate 1 in the area in which the memory cell transistor is formed. Thereafter, the resist pattern 52 is removed (FIGS. 10A and 10B).

Subsequently, the silicon oxide film 11a to be the tunnel insulating film 11 is formed on the semiconductor substrate 1 and the conductive film 22a by thermal oxidization, and on the oxide film 11a, the silicon nitride (SiN) film 12a to be the charge trap film 12 is formed by CVD. On the nitride film 12a, the aluminum oxide ($Al_2O_3$) film 13a to be the block insulating film 13 is formed by CVD, and on the aluminum oxide film 13a, the conductive film (polysilicon film) 14a including impurities is formed as a conductive film to be the control gate electrode 14 (FIGS. 11A and 11B). These films are formed along the shape of the conductive film 22a, and therefore, at an upper part of the tapered portion of the conductive film 22a is in a tapered shape.

Figure 12A:
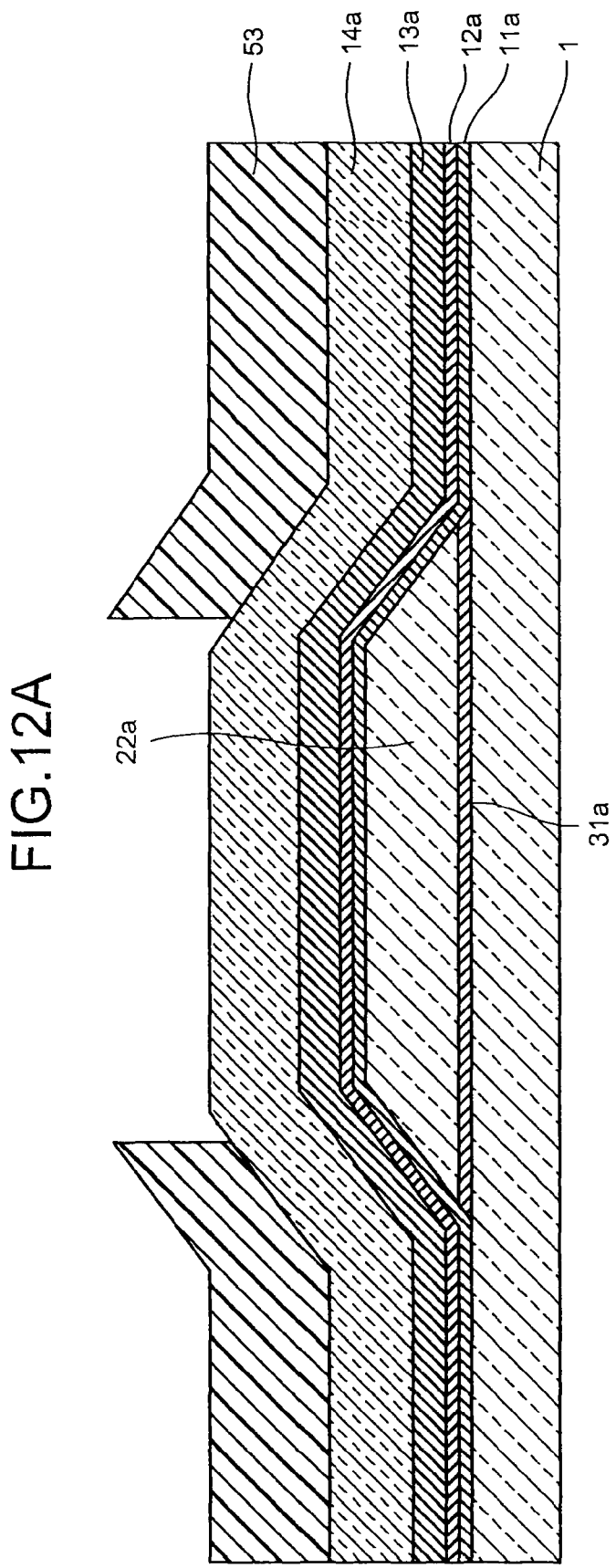

Furthermore, a resist pattern 53 is formed by PEP (FIGS. 12A and 12B). The resist pattern 53 is formed to cover a part of the area in which the memory cell transistor and the select gate transistor are formed on the conductive film 14a, and to open the other areas. At this time, the resist pattern 53 covers from the area of the memory cell transistor to a portion near a top end of the tapered portion of the conductive film 14a.

Figure 13A:
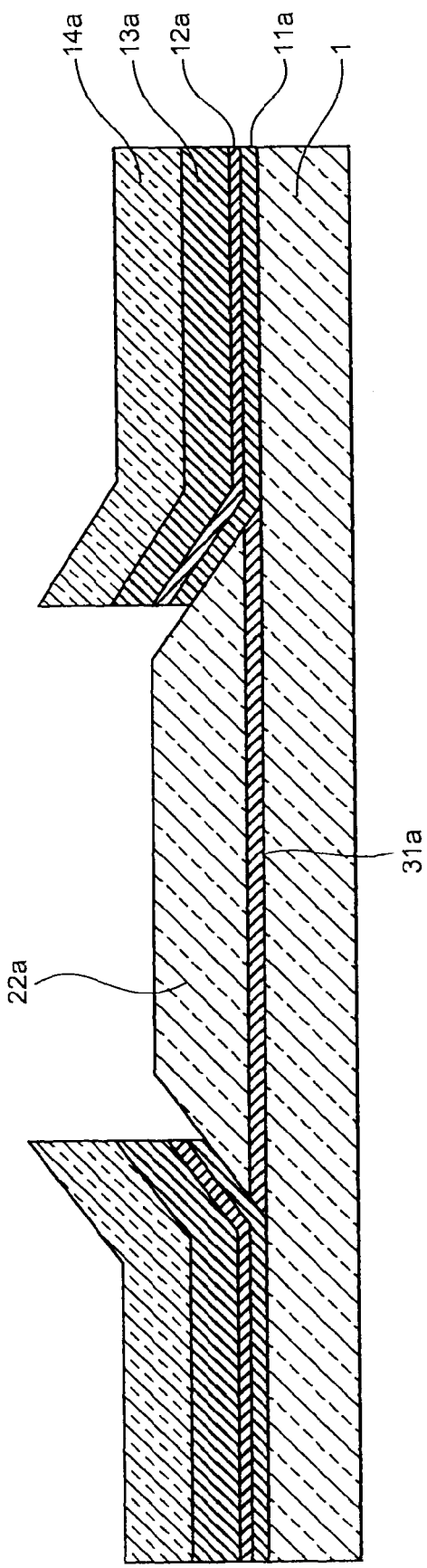
FIGS. 13A and 13B are cross-sections of a manufacturing method of the MONOS-type NAND flash memory according to the embodiment.
Figure 13B:
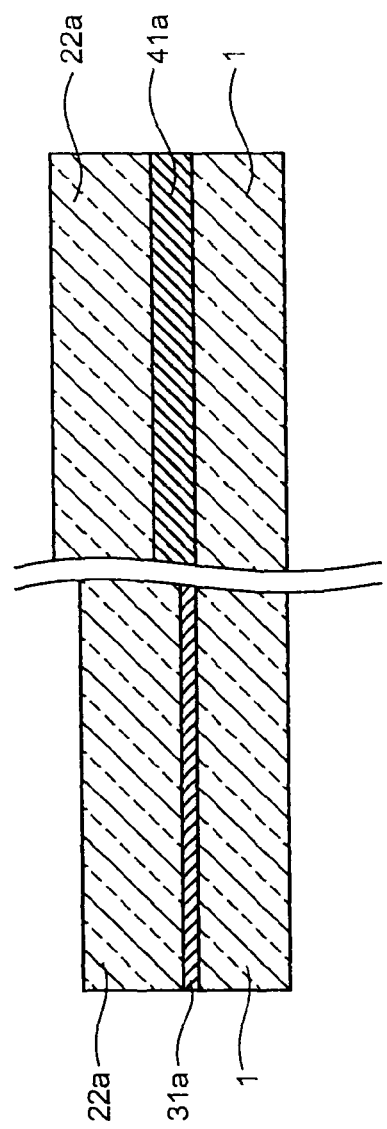

Further, using the resist pattern 53 as a mask, etching is performed on the conductive film 14a, the silicon oxide film 11a, the silicon nitride film 12a, the aluminum oxide film 13a, and the conductive film 14a by RIE, to expose the conductive film 22a. Thereafter, the resist pattern 53 is removed (FIGS. 13A and 13B).

In the manufacturing process of a semiconductor device, generally, a device isolation region in a shallow trench isolation (STI) structure to isolate the device regions (active areas) is formed in either process prior to formation of a gate electrode; however, explanations thereof will be omitted, because it is not essential in the present embodiment.

Figure 15A:
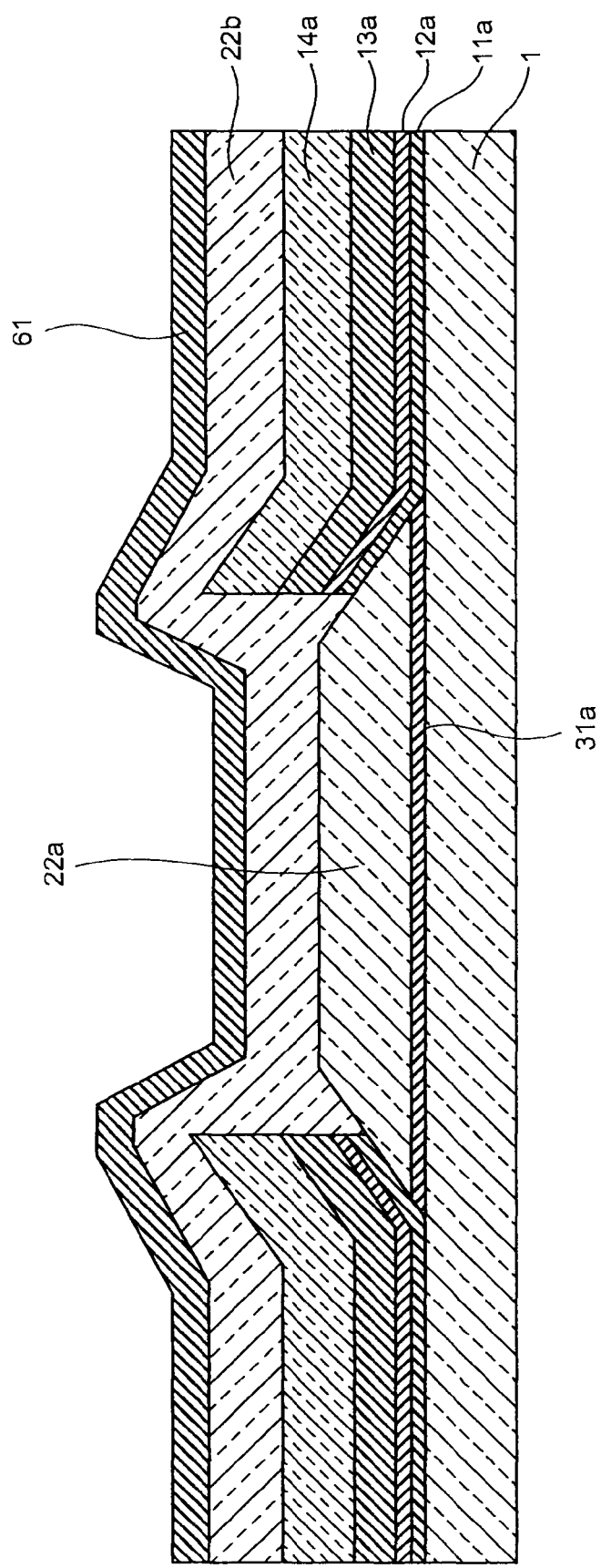
FIGS. 15A and 15B are cross-sections of a manufacturing method of the MONOS-type NAND flash memory according to the embodiment.
Figure 15B:
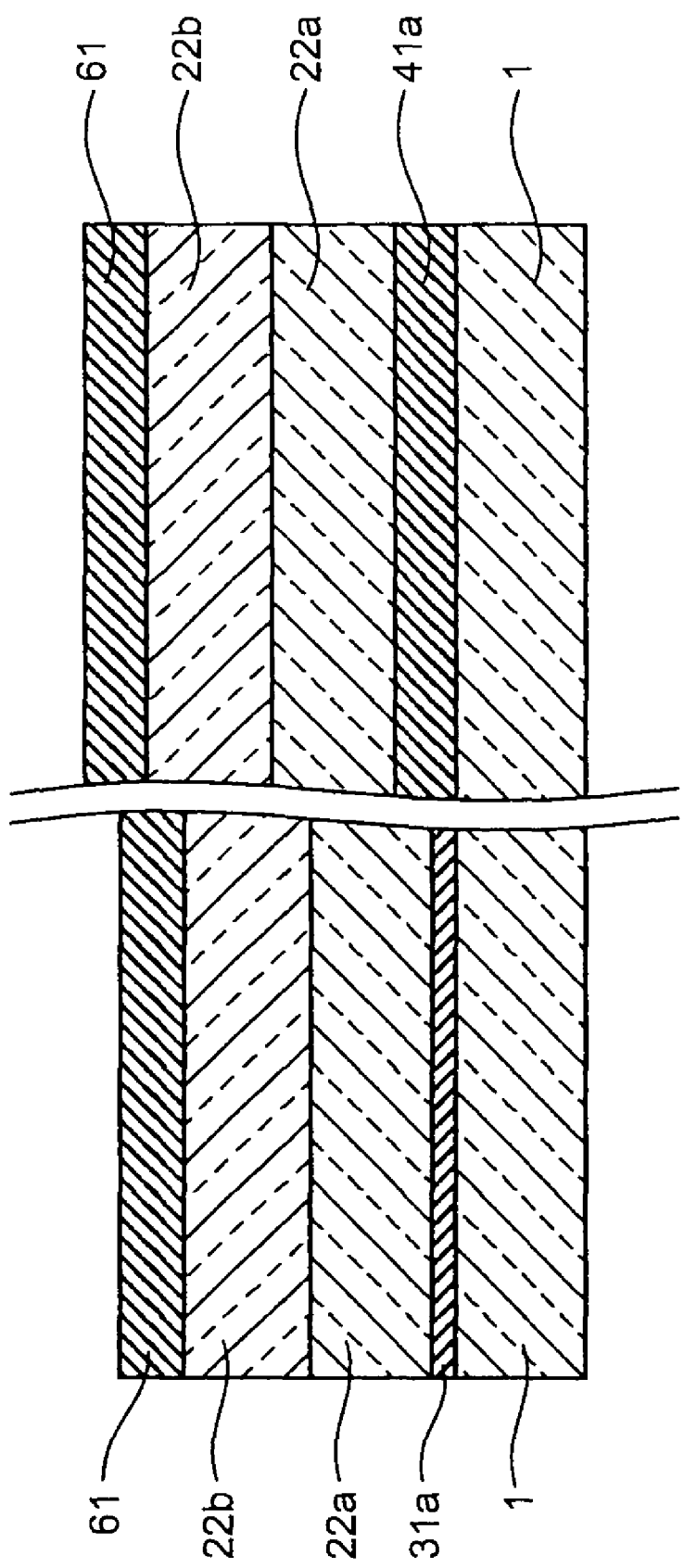
Figure 16B:
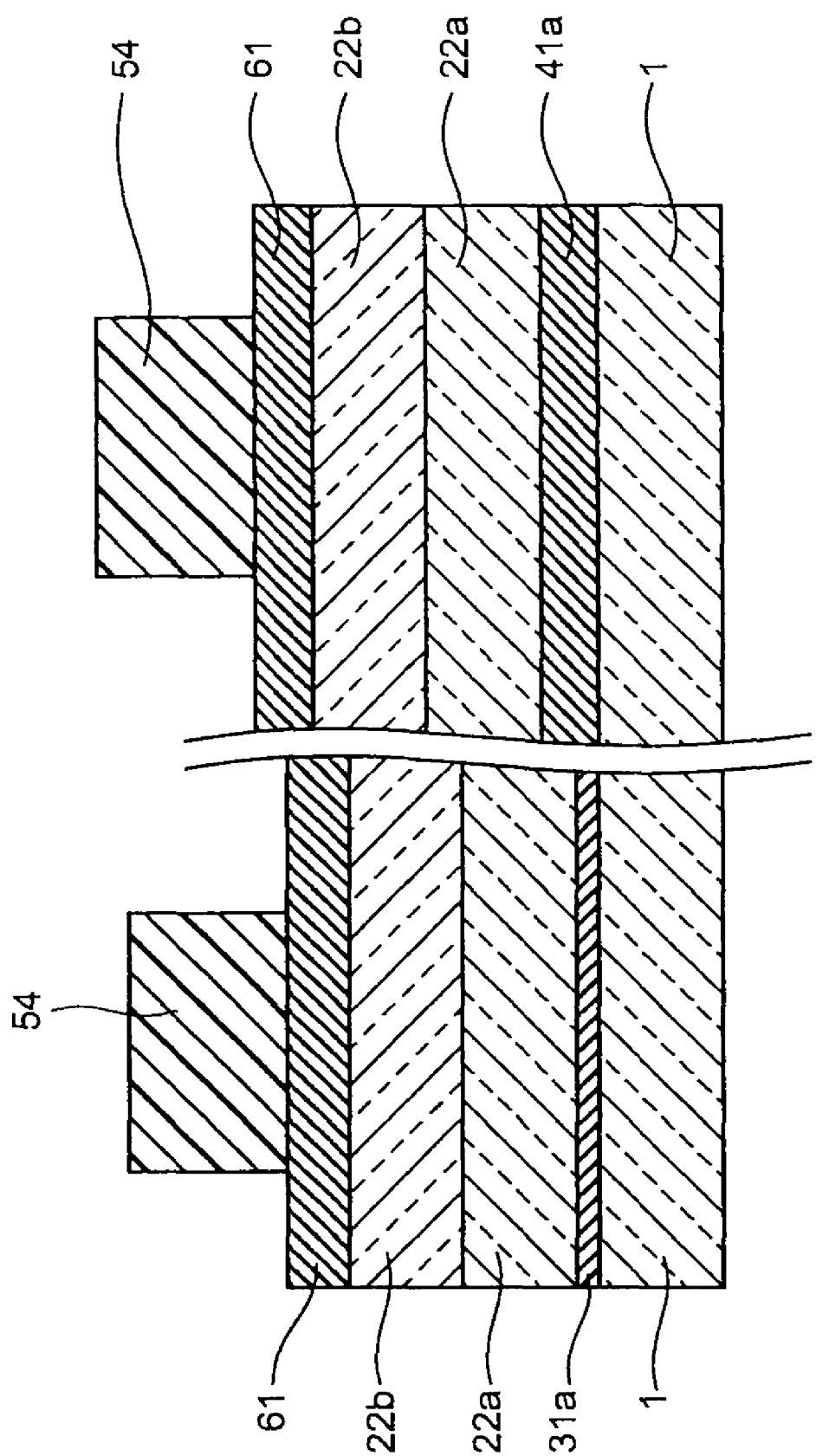

A conductive polysilicon film including impurities is then formed as a conductive film 22b on the conductive film 14a and the conductive film 22a by CVD (FIGS. 14A and 14B). The conductive film 22b is formed in such a thickness to connect the conductive film 22a and the conductive film 14a. On the conductive film 22b, a silicon nitride (SiN) film is formed as a hard mask film 61 having a high etching selection ratio with respect to the conductive film 22a by CVD (FIGS. 15A and 15B). Further, a resist pattern 54 is formed on the hard mask film 61 by PEP (FIGS. 16A and 16B). The resist pattern 54 is formed to cover areas in which the gate electrode of the memory cell transistor, the gate electrode of the select gate transistor, the gate electrode of the low voltage transistor, and the gate electrode of the high voltage transistor are formed, and to open the other areas.

Out of the resist pattern 54, in a resist pattern 54a at a position at which the gate electrode of the select gate transistor is formed, an end on a side of the area in which the memory cell transistor is formed is positioned above a tapered portion 22at of the conductive film 22a, and is positioned on a side of the area in which the memory cell transistor is formed relative to an end surface of the silicon oxide film 11a, the silicon nitride film 12a, the aluminum oxide film 13a, and the conductive film 14a. Furthermore, it is positioned above the tapered portion 22at of the conductive film 22a, and is arranged on an opposite side to the area in which the memory cell transistor is formed from a position at which the tapered shape of the tapered portion 22at of the conductive film 22a starts.

Further, an end of the resist pattern 54a on the opposite side to the area in which the memory cell transistor is formed is positioned on an opposite side to the area in which the memory cell transistor is formed at least relative to an end surface of the silicon oxide film 11a, the silicon nitride film 12a, the aluminum oxide film 13a, and the conductive film 14a above the tapered portion 22at of the conductive film 22a.

Figure 17A:
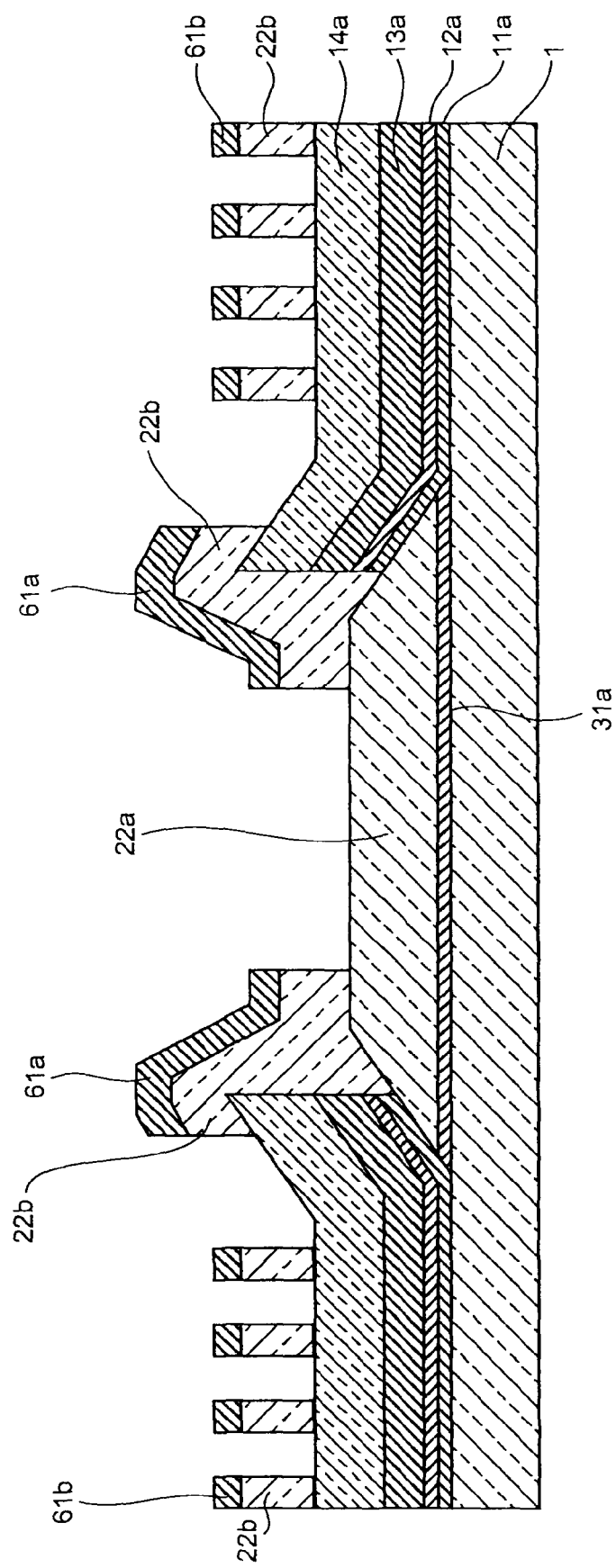

Next, using the resist pattern 54 as a mask, etching is performed on the hard mask film 61 and the conductive film 22b by RIE, to pattern the hard mask film 61 into the gate electrodes of the memory cell transistor, the select gate transistor, the low voltage transistor, and the high voltage transistor. Thus, the hard mask film 61 is patterned into a hard mask 61a that is formed into a shape of the gate electrode of the select gate transistor in the area in which the select gate transistor is formed, a hard mask 61b that is formed into a shape of the gate electrode of the memory cell transistor in the area in which the memory cell transistor is formed, and a hard mask 61c that is formed into a shape of the gate electrodes of the low voltage transistor and the high voltage transistor in the peripheral circuit area. Thereafter, the resist pattern 54 is removed (FIGS. 17A and 17B).

Respective gate electrode forming (patterning) process is then performed. This process is performed in two processes of a gate-electrode forming process of the memory cell transistor and a gate-electrode forming process of the select gate transistor, the low voltage transistor, and the high voltage transistor.

First, a resist pattern 55 is formed by PEP. The resist pattern 55 is formed to cover the hard mask 61a that is formed in the area in which the select gate transistor is formed, and the conductive film 22a in an area sandwiched between the hard masks 61a opposite to each other, out of the area in which the select gate transistor is formed. The resist pattern 55 should be formed to cover at least the conductive film 22a in the area between the hard masks 61a opposite to each other. Furthermore, the resist pattern 55 is formed to cover the peripheral circuit area. The resist pattern 55 is to protect the conductive film 22a in the area between the hard masks 61a from etching.

Figure 18A:
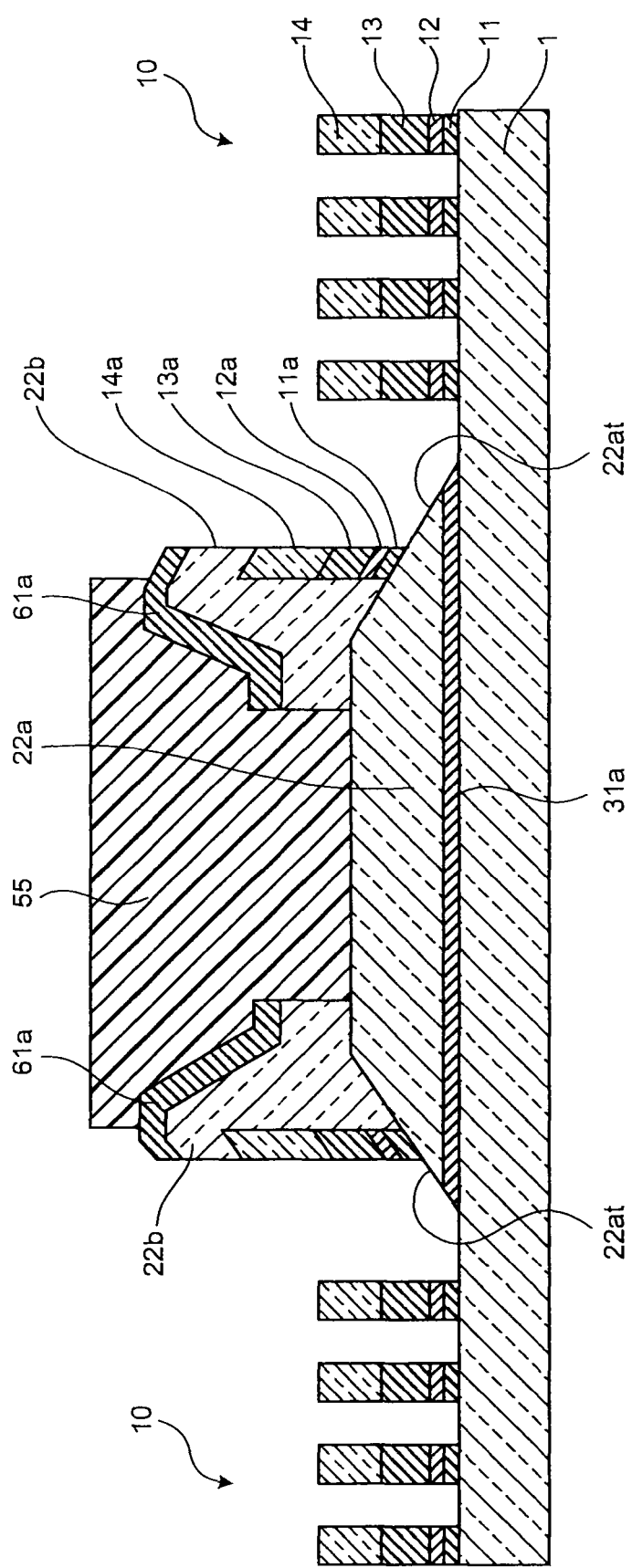
FIGS. 18A and 18B are cross-sections of a manufacturing method of the MONOS-type NAND flash memory according to the embodiment.
Figure 18B:
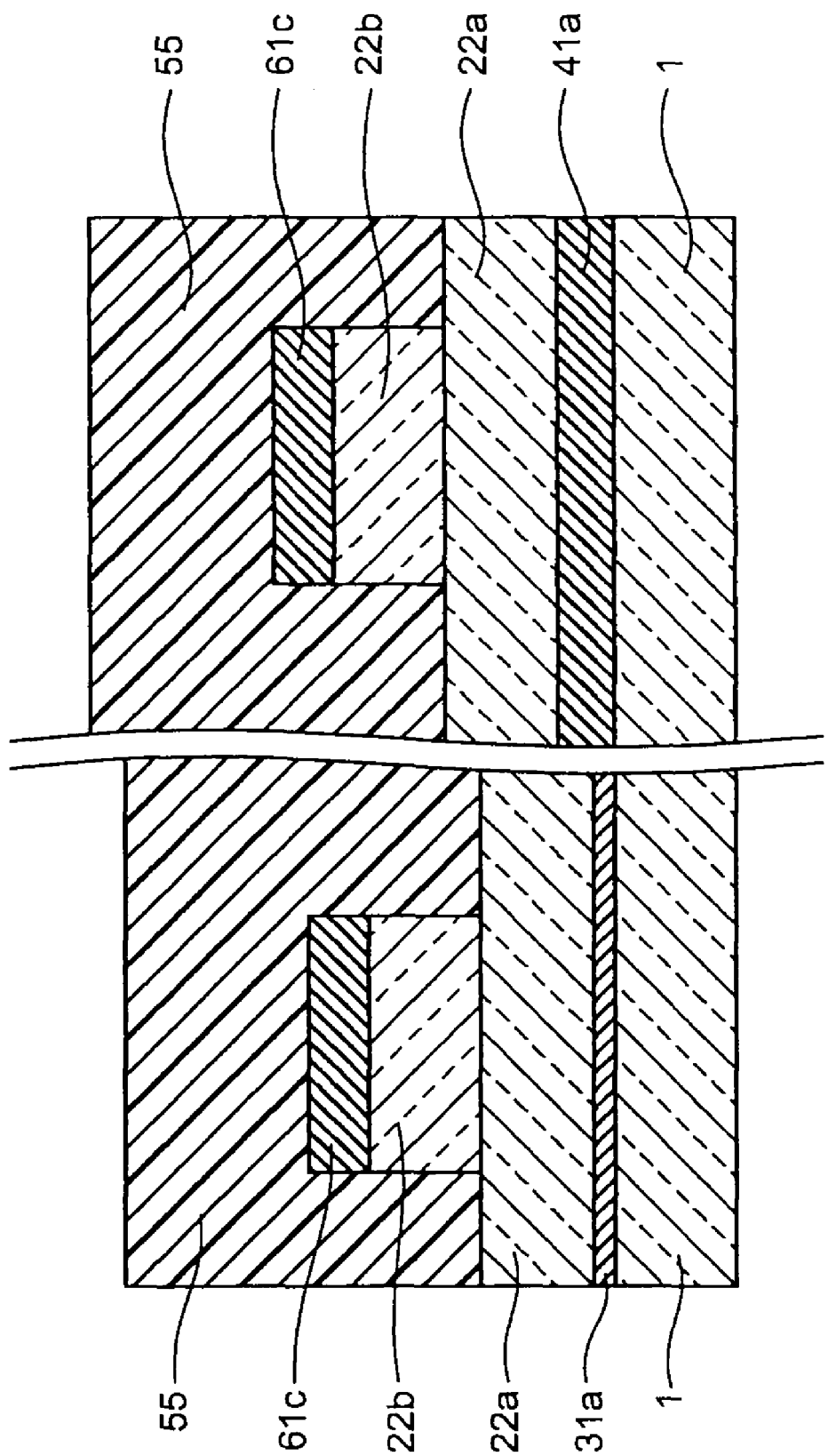

While protecting the area in which the select gate transistor is formed, the area in which the low voltage transistor is formed, and the area in which the high voltage transistor is formed out of the memory cell region using the resist pattern 55 as a mask, the silicon oxide film 11a, the silicon nitride film 12a, the aluminum oxide film 13a, and the conductive film 14a are etched in a direction perpendicular to the in-plane direction of the semiconductor substrate 1 using the hard mask 61b that is formed in the area in which the memory cell transistor is formed. The hard mask 61b is then removed, and the conductive film 22b in the area in which the memory cell transistor is formed is removed. Thus, the gate electrode 10 of the memory cell transistor in a four-layer structure in which the tunnel insulating film 11, the charge trap film 12, the block insulating film 13, and the control gate electrode 14 are sequentially layered is formed on the semiconductor substrate 1 in the area in which the memory cell transistor is formed. Furthermore, in the area in which the select gate transistor is formed, an end surface of the gate electrode of the select gate transistor on the side of the area in which the memory cell transistor is formed is formed (FIGS. 18A and 18B). At this time, the end surface of the gate electrode of the select gate transistor on the side of the area in which the memory cell transistor is formed is positioned on the opposite side to the area in which the memory cell transistor is formed relative to the point at which the tapered portion of the gate electrode 22 of the select gate transistor starts on the insulating film 31a. The resist pattern 55 is then removed.

After the etching in this process, a cut end surface of the silicon oxide film 11a, the silicon nitride film 12a, the aluminum oxide film 13a, and the conductive film 14a on the conductive film 22a is positioned above the tapered portion 22at of the conductive film 22a. It is important to position this end surface above the tapered portion 22at of the conductive film 22a. If this end surface is positioned not above the tapered portion 22at of the conductive film 22a, but on the insulating film 31a or the surface of the semiconductor substrate 1, the MONOS structure same as the gate electrode 10 of the memory cell transistor is formed on the semiconductor substrate 1 in contact with the gate electrode 20 of the select gate transistor.

Next, a resist pattern 56 is formed by PEP. The resist pattern 56 is formed to cover the area in which the memory cell transistor is formed. Moreover, the resist pattern 56 is formed to open an area (area in which the conductive film 22a exposes) opposite to the area in which the memory cell transistor is formed through the hard mask 61a in the area in which the select gate transistor is formed, and the peripheral circuit area. It is preferable that a portion around an end surface of the gate electrode of the select gate transistor on the opposite side to the area in which the memory cell transistor is formed on the hard mask 61a be exposed. This enables to remove the conductive film 22a accurately at the position of the end surface of the hard mask 61a by etching in the following process.

Using the resist pattern 56 and the hard mask 61a as a mask, the conductive film 22a of the select gate transistor is etched in the direction perpendicular to the in-plane direction of the semiconductor substrate 1. At this time, the conductive film 22b is etched such that a portion that connects the conductive film 22a and the conductive film 14a remains. Thus, an end surface of the gate electrode of the select gate transistor on the opposite side to the area in which the memory cell transistor is formed is formed. Furthermore, in the peripheral circuit area, the conductive film 22a, the insulating film 31a, and the insulating film 41a are etched in the direction perpendicular to the in-plane direction of the semiconductor substrate 1 using the hard mask 61c. Thereafter, the hard mask 61c is removed, and the conductive film 22b in the peripheral circuit area is removed (FIGS. 19A and 19B). The resist pattern 56 is then removed.

Thus, the gate electrode 20 of the select gate transistor in a two-layer structure in which the gate insulating film 21 and the gate electrode 22 are sequentially layered is formed on the semiconductor substrate 1. In the gate electrode 20 of the select gate transistor, an end of the gate electrode 22 on a side of the gate electrode 10 of the select gate transistor is formed into a tapered portion in a tapered shape, and on this tapered portion, the silicon oxide film 11a, the silicon nitride film 12a, the aluminum oxide film 13a, and the conductive film 14a are layered in this sequence. That is, it is structured such that the gate electrode 22 of the select gate transistor comes under the silicon oxide film 11a, the silicon nitride film 12a, the aluminum oxide film 13a, and the conductive film 14a that are layered on the tapered portion.

Figure 20A:
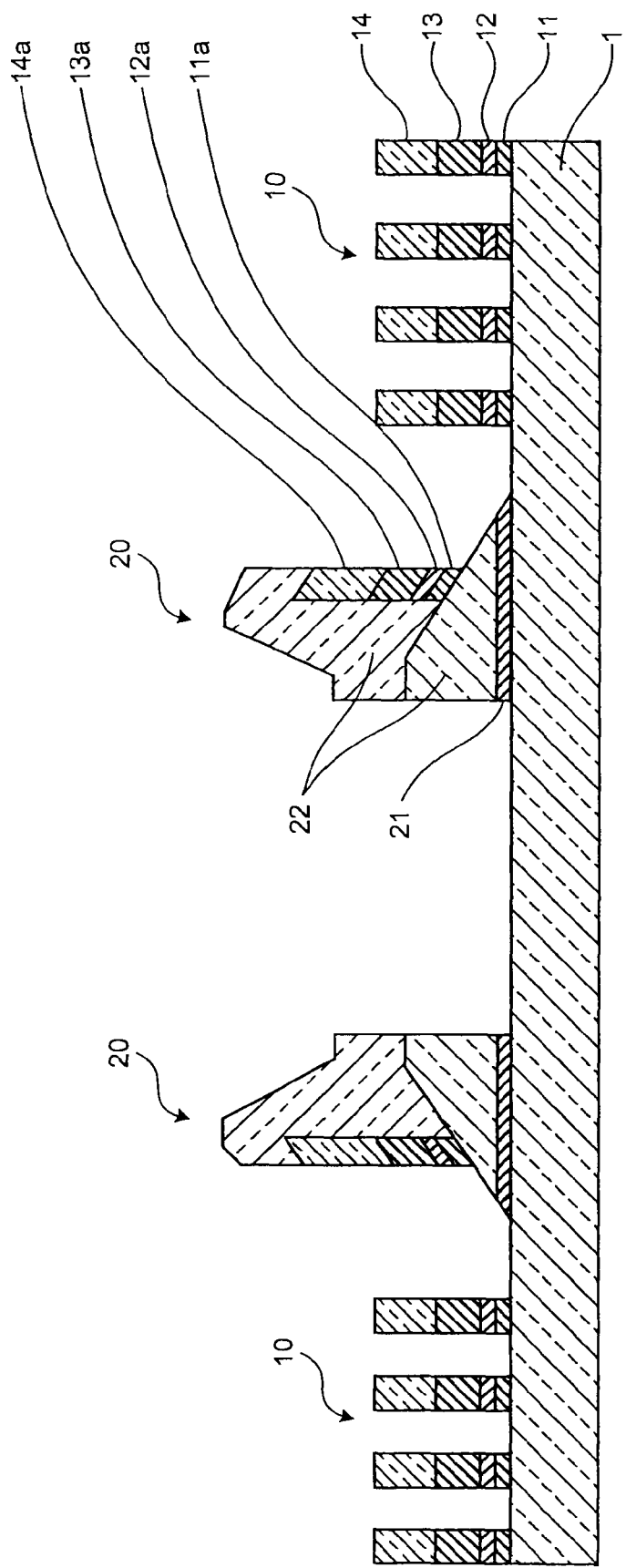

Further, in the peripheral circuit area, the low voltage transistor 30 in a two-layer structure in which the gate insulating film 31 and the gate electrode 32 are sequentially layered on the semiconductor substrate 1 and the high voltage transistor 40 in a two-layer structure in which the gate insulating film 41 and the gate electrode 42 are sequentially formed on the semiconductor substrate 1 are formed (FIGS. 20A and 20B).

An end surface (end of the gate electrode of the select gate transistor on the opposite side to the memory cell 10) of the gate electrode 22 (the conductive film 22a and the conductive film 22b) that is cut by etching in this process is at a position separated from the silicon oxide film 11a, the silicon nitride film 12a, the aluminum oxide film 13a, and the conductive film 14a remaining on the tapered portion of the gate electrode 22. It is important to arrange the end surface (end of the gate electrode of the select gate transistor on the opposite side to the memory cell 10) of the gate electrode 22 at such a position. If the end of the gate electrode 22 (end of the gate electrode of the select gate transistor on the opposite side to the gate electrode 10 of the memory cell transistor) is positioned closer to the gate electrode 10 of the memory cell transistor than the above position, the gate electrode 22 and the conductive film 14a on the oxide film 13a are not to be electrically connected, and therefore the gate electrode 22 does not function as a gate electrode.

Thereafter, necessary ion implantation is performed to form respective transistors; however, explanations thereof will be omitted, because it is not essential in the present embodiment.

As described above, in the present embodiment, the end of the gate electrode (end surface of the gate electrode 22 (conductive film 22a)) of the select gate transistor on the side of the gate electrode 10 of the memory cell transistor is tapered, thereby obtaining such a structure that the gate electrode 22 comes under the silicon oxide film 11a, the silicon nitride film 12a, the aluminum oxide film 13a, and the conductive film 14a remaining at the end of the gate electrode of the select gate transistor, and forming the gate electrode 20 of the select gate transistor in the MOS structure same as that of the gate electrode of the low voltage transistor 30. Thus, a MONOS-type NAND flash memory with high readout reliability can be manufactured in which erroneous readout due to the structure of the gate electrode 20 of the select gate transistor is prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising: a gate electrode of a memory transistor including a first insulating layer that is formed on a semiconductor substrate, a charge storage layer that is formed on the first insulating layer, a second insulating layer that is formed on the charge storage layer, and a gate electrode that is formed on the second insulating layer; and a gate electrode of a select gate transistor that is formed adjacent to the gate electrode of the memory cell transistor, the gate electrode of the select gate transistor including a gate insulating film that is formed on the semiconductor substrate, a lower gate electrode that is formed on the gate insulating film and that has a tapered portion in a tapered shape at a first side surface on a side of the gate electrode of the select gate transistor, and the first side surface has a tapered angle side on the memory cell transistor side, and a second side surface, which is disposed on an opposite side of the first side surface, has a larger angle than that of the first side surface, a first oxide film that is formed on the tapered portion of the lower gate electrode, a silicon nitride film that is formed on the first oxide film, a second oxide film that is formed on the silicon nitride film, a conductive film that is formed on the second oxide film, and an upper gate electrode that is connected to the conductive film and the lower gate electrode.

2. The nonvolatile semiconductor memory device according to claim 1, wherein the first oxide film of the gate electrode of the select gate transistor is positioned on an opposite side to the gate electrode of the memory transistor relative to a starting point of the tapered portion of the lower gate electrode on the gate insulating film.

3. The nonvolatile semiconductor memory device according to claim 1, wherein the upper gate electrode is connected to the conductive film and the lower gate electrode at a portion positioned opposite to the gate electrode of the memory transistor relative to the first oxide film on the lower gate electrode.

4. The nonvolatile semiconductor memory device according to claim 1, wherein
- in the gate electrode of the memory transistor, the first insulating layer is a silicon oxide film, the charge storage layer is a silicon nitride film, the second insulating film is an aluminum oxide film, and the gate electrode is a conductive polysilicon film, and
- in the gate electrode of the select gate transistor, the gate insulating film is a silicon oxide film, the lower gate electrode is a conductive polysilicon film, the first oxide film is a silicon oxide film, the second oxide film is an aluminum oxide film, the conductive film is a conductive polysilicon film, and the upper gate electrode is a conductive polysilicon film.

5. The nonvolatile semiconductor memory device according to claim 1, wherein
- NAND cell units are formed in a matrix in the nonvolatile semiconductor memory device, each of the NAND cell units constituted of two units of the select gate transistors and a plurality of the memory transistors that are connected in series using a source region and a drain region in common between memory transistors that are arranged adjacent to each other between the two units of the select gate transistors.

6. The nonvolatile semiconductor memory device according to claim 1, wherein the gate insulating film is formed on the semiconductor substrate which is substantially flat.

* * * * *